(12) United States Patent
Kim et al.

(10) Patent No.: US 11,296,180 B2
(45) Date of Patent: Apr. 5, 2022

(54) DISPLAY APPARATUS HAVING A TRANSMITTING AREA

(71) Applicant: SAMSUNG DISPLAY CO., LTD., Yongin-si (KR)

(72) Inventors: Kyeonghwa Kim, Yongin-si (KR); Nuree Um, Yongin-si (KR); Kyunghoon Kim, Yongin-si (KR); Mihae Kim, Yongin-si (KR); Jaedu Noh, Yongin-si (KR); Kyonghwan Oh, Yongin-si (KR); Seunghee Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/228,636

(22) Filed: Apr. 12, 2021

(65) Prior Publication Data

US 2022/0020840 A1    Jan. 20, 2022

(30) Foreign Application Priority Data

Jul. 15, 2020    (KR) ........................ 10-2020-0087710

(51) Int. Cl.
*H01L 27/32* (2006.01)
*G09G 3/3225* (2016.01)
*G09G 3/3266* (2016.01)
*G09G 3/3291* (2016.01)

(52) U.S. Cl.
CPC ....... *H01L 27/3276* (2013.01); *G09G 3/3225* (2013.01); *G09G 3/3266* (2013.01); *G09G 3/3291* (2013.01); *G09G 2300/0439* (2013.01)

(58) Field of Classification Search
CPC ............ H01L 27/3276; H01L 51/5262; G09G 3/3225; G09G 3/3266; G09G 3/3291
See application file for complete search history.

(56) References Cited

U.S. PATENT DOCUMENTS

| 8,018,405 B2 | 9/2011 | Kwak et al. |
| 9,853,096 B1 * | 12/2017 | Choi .................. H01L 27/3276 |
| 9,940,888 B2 * | 4/2018 | Ryoo ................. H01L 27/3276 |

(Continued)

FOREIGN PATENT DOCUMENTS

| KR | 10-0662998 | 12/2006 |
| KR | 10-2012-0077345 | 7/2012 |

(Continued)

*Primary Examiner* — Sardis F Azongha

(74) *Attorney, Agent, or Firm* — F. Chau & Associates, LLC

(57) ABSTRACT

A display apparatus includes a substrate including a transmitting area, a display area surrounding the transmitting area, a first non-display area disposed between the transmitting area and the display area, and a second non-display area surrounding the display area. A plurality of pixels is arranged in the display area. A set of 2n connection wirings (where n is a positive integer) is disposed in the first non-display area and each of the 2n connection wirings extends along at least a part of an edge of the transmitting area. Each of a plurality of voltage wirings extends in a first direction and is connected to at least some of pixels disposed in a common row from among the plurality of pixels. Each of the plurality of voltage wirings is connected to one of the 2n connection wirings.

21 Claims, 14 Drawing Sheets

(56) References Cited

U.S. PATENT DOCUMENTS

| | | | |
|---|---|---|---|
| 10,134,826 B2 | 11/2018 | Ka et al. | |
| 10,964,771 B2 * | 3/2021 | Lee | G09G 3/3233 |
| 11,011,595 B2 * | 5/2021 | Lee | H01L 51/524 |
| 11,114,523 B2 * | 9/2021 | Park | H01L 27/3223 |
| 2019/0214595 A1 | 7/2019 | Park | |
| 2020/0044006 A1 | 2/2020 | Lee et al. | |
| 2020/0058728 A1 * | 2/2020 | Song | H01L 27/3279 |

FOREIGN PATENT DOCUMENTS

| | | |
|---|---|---|
| KR | 10-2017-0117291 | 10/2017 |
| KR | 10-2019-0085202 | 7/2019 |
| KR | 10-2020-0015868 | 2/2020 |

\* cited by examiner

DISPLAY APPARATUS HAVING A TRANSMITTING AREA

CROSS-REFERENCE TO RELATED APPLICATION

This application is based on and claims priority under 35 U.S.C. § 119 to Korean Patent Application No. 10-2020-0087710, filed on Jul. 15, 2020, in the Korean Intellectual Property Office, the disclosure of which is herein incorporated by reference in its entirety.

TECHNICAL FIELD

The present disclosure relates to a display apparatus, and more particularly, to a display apparatus having a transmitting area.

DISCUSSION OF RELATED ART

A display apparatus is an apparatus for visually displaying data. A display apparatus is used for smaller products such as mobile phones or for larger products such as televisions.

A display apparatus includes a substrate divided into a display area and a non-display area. A gate line and a data line are formed within the display area and are insulated from each other. A plurality of pixel regions are defined in the display area, and pixels respectively disposed within the plurality of pixel regions receive electrical signals from the gate line and the data line that intersects the gate line such that the pixels emit light, thereby displaying an image to a viewer. A thin-film transistor and a pixel electrode electrically connected to the thin-film transistor are provided in each pixel region, and a counter electrode is commonly provided over the pixel regions. There may be various wirings for transmitting electrical signals to the pixels in the display area disposed within the non-display area. The non-display area may additionally include a gate driver, and pads to which a data driver and a controller may be connected.

Recently, display apparatuses have been used for various purposes. In addition, as thicknesses and weights of display apparatuses have decreased, the range of applications of display apparatuses has increased.

SUMMARY

A display apparatus includes a substrate including a transmitting area, a display area surrounding the transmitting area, a first non-display area disposed between the transmitting area and the display area, and a second non-display area surrounding the display area. A plurality of pixels is arranged in the display area. 2n connection wirings (where n is a positive integer) are disposed in the first non-display area and extend along at least a part of an edge of the transmitting area. A plurality of voltage wirings each extending in a first direction and connected to at least some of pixels is disposed in the same row from among the plurality of pixels. Each of the plurality of voltage wirings is connected to one of the 2n connection wirings.

First through $2n^{th}$ voltage wirings from among the plurality of voltage wirings may be connected in a one-to-one manner to the 2n connection wirings according to a predetermined order.

A connection wiring, from among the 2n connection wirings, connected to an $i^{th}$ voltage wiring from among the plurality of voltage wirings may be the same as a connection wiring, from among the 2n connection wirings, connected to a $(2n+i)^{th}$ voltage wiring from among the plurality of voltage wirings.

The display apparatus may further include a plurality of first scan lines each extending in the first direction and connected to pixels disposed in the same row from among the plurality of pixels, a plurality of second scan lines each extending in the first direction and connected to pixels disposed in the same row from among the plurality of pixels, and a gate driving circuit disposed in the second non-display area and configured to drive the plurality of first scan lines and the plurality of second scan lines. The plurality of first scan lines may also be connected to pixels disposed in a previous row from among the plurality of pixels.

The gate driving circuit may be configured to sequentially output first and second scan signals to the plurality of first and second scan lines in an MC n-clk mode. Each of the plurality of first scan lines may transmit n first scan signals during one frame, each of the plurality of second scan lines may transmit n second scan signals during one frame, and the pixels may alternately receive the n first scan signals and the n second scan signals.

In a first interval, pixels connected to $j^{th}$ through $(j+2n-1)^{th}$ voltage wirings from among the plurality of voltage wirings may receive an initialization voltage through the $j^{th}$ through $(j+2n-1)^{th}$ voltage wirings in response to the n first scan signals.

The $j^{th}$ through $(j+2n-1)^{th}$ voltage wirings may be connected to different connection wirings from among the 2n connection wirings.

Pixels connected to a $j^{th}$ voltage wiring from among the plurality of voltage wirings may receive an initialization voltage during $k^{th}$ through $(k+2n-1)^{th}$ intervals through the $j^{th}$ voltage wiring in response to the n first scan signals.

The display apparatus may further include an initialization voltage supply wiring disposed in the second non-display area. One end of the plurality of voltage wirings may be connected to the 2n connection wirings, respectively, and the other end of the plurality of voltage wirings may be connected to the initialization voltage supply wiring.

Each of the plurality of voltage wirings may include a plurality of first voltage wirings and a plurality of second voltage wirings spaced apart from each other by the transmitting area.

The 2n connection wirings may include 2n first connection wirings and 2n second connection wirings disposed on opposite sides of the transmitting area. The 2n first connection wirings may be spaced apart from the 2n second connection wirings.

Each of the plurality of first voltage wirings may be connected to one of the 2n first connection wirings, and each of the plurality of second voltage wirings may be connected to one of the 2n second connection wirings.

The display apparatus may further include a storage capacitor including a lower electrode and an upper electrode disposed on and at least partially overlapping the lower electrode, an insulating layer disposed on the storage capacitor, and a data line disposed on the insulating layer, wherein the plurality of voltage wirings and the upper electrode are disposed on the same layer, and the 2n connection wirings and the data line are disposed on the same layer.

Each of the plurality of pixels may receive first through third scan signals, a data voltage, and an initialization voltage. Each of the plurality of pixels may include a light-emitting device, a driving thin-film transistor configured to control a level of current flowing through the light-emitting device according to a gate-source voltage, a storage capacitor disposed between a power supply line and a gate of the driving thin-film transistor, a scan thin-film transistor configured to transmit the data voltage to a source of the driving thin-film transistor in response to the second scan signal, a compensation thin-film transistor configured to connect a drain and the gate of the driving thin-film transistor in response to the second scan signal, a gate initialization thin-film transistor configured to apply the initialization voltage to the gate of the driving thin-film transistor in response to the first scan signal, and an anode initialization thin-film transistor configured to apply the initialization voltage to an anode of the light-emitting device in response to the third scan signal.

The first scan signal may be synchronized with the second scan signal of a previous row, and the third scan signal may be the same as the first scan signal of a next row.

A display apparatus includes a substrate including a transmitting area, a display area surrounding the transmitting area, a first non-display area disposed between the transmitting area and the display area, and a second non-display area surrounding the display area. A plurality of pixels is arranged in the display area. Six connection wirings are disposed in the first non-display area and each connection wiring thereof extends along at least a part of an edge of the transmitting area. A plurality of voltage wirings each extend in a first direction and are each connected to at least some of the pixels disposed in the same row from among the plurality of pixels. Each of the plurality of voltage wirings is connected to one of the six connection wirings.

First through sixth voltage wirings from among the plurality of voltage wirings may be connected in a one-to-one manner to the six connection wirings according to a predetermined order.

A connection wiring, from among the six connection wirings, connected to an $i^{th}$ voltage wiring from among the plurality of voltage wirings may be the same as a connection wiring, from among the six connection wirings, connected to a $(6+i)^{th}$ voltage wiring from among the plurality of voltage wirings.

The display apparatus may further include a plurality of first scan lines each extending in the first direction and connected to pixels disposed in the same row from among the plurality of pixels, a plurality of second scan lines each extending in the first direction and connected to pixels disposed in the same row from among the plurality of pixels, and a gate driving circuit disposed in the second non-display area and configured to drive the plurality of first scan lines and the plurality of second scan lines. The plurality of first scan lines may also be connected to pixels disposed in a previous row from among the plurality of pixels. The gate driving circuit may be configured to sequentially output first and second scan signals to the plurality of first and second scan lines in an MC 3-clk mode. Each of the plurality of first scan lines may transmit three first scan signals during one frame, each of the plurality of second scan lines may transmits three second scan signals during one frame, and the pixels may alternately receive the three first scan signals and the three second scan signals.

In a first interval, pixels connected to $j^{th}$ through $(j+5)^{th}$ voltage wirings from among the plurality of voltage wirings may receive an initialization voltage through the $j^{th}$ through $(j+5)^{th}$ voltage wirings in response to the three first scan signals.

A display apparatus includes a substrate including a display area, an opening within the display area and a non-display area disposed between the opening and the display area. A plurality of connection wirings is disposed in the non-display area and at least partially circumscribes the opening. A plurality of voltage wirings connects each of the connection wirings to a corresponding pixel within the display area.

The plurality of connection wirings may include 2n connection wirings, where n is a positive integer.

The opening may have a substantially curved side. Each of the plurality of connection wirings may be curved. Each of the voltage wirings may be straight.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
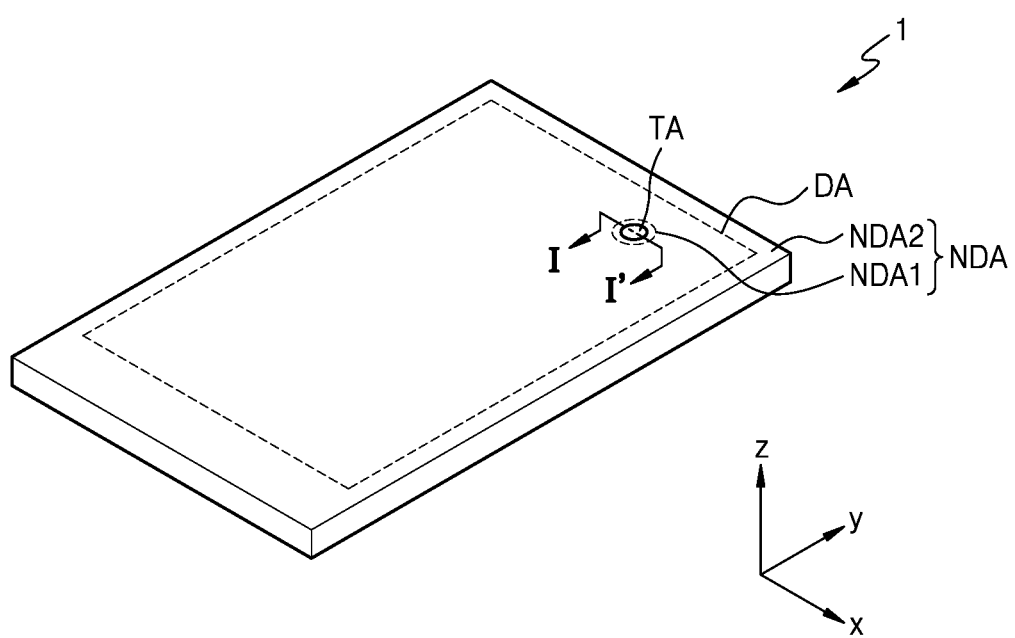
FIG. 1 is a perspective view illustrating a display apparatus according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. Like reference numerals may refer to like elements throughout the specification and the drawings. In this regard, the present embodiments may have different forms and is not necessarily limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. In contrast the phrase "consisting of" is used to specify the exclusive presence of the stated features or components, with the preclusion of additional features or components.

It will be understood that when a layer, region, or element is referred to as being "on" another layer, region, or element, it may be directly on the other layer, region, or element or may be indirectly on the other layer, region, or element with intervening layers, regions, or elements disposed therebetween.

Sizes of elements in the drawings may be exaggerated or contracted for convenience of explanation. The following embodiments are not necessarily limited thereto.

When a certain embodiment may be implemented differently, a specific process order may be different from the described order. For example, two consecutively described processes may be performed substantially at the same time or performed in an order opposite to the described order.

"A and/or B" is used to select only A, select only B, or select both A and B. "At least one of A and B" is used to select only A, select only B, or select both A and B.

It will be understood that when a layer, region, or component is referred to as being "connected" to another layer, region, or component, it may be "directly connected" to the other layer, region, or component and/or may be "indirectly connected" to the other layer, region, or component with other layers, regions, or components interposed therebetween. For example, when a layer, a region, or an element is electrically connected, the layer, the region, or the element may be directly electrically connected or may be indirectly electrically connected with intervening layers, regions, or elements disposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view illustrating a display apparatus according to an exemplary embodiment of the present disclosure.

Referring to FIG. 1, a display apparatus 1 includes a display area DA that emits light and a non-display area NDA that does not emit light. The non-display area NDA is disposed adjacent to the display area DA. The display apparatus 1 may generate a desired image by using light emitted by a plurality of pixels disposed in the display area DA.

The display apparatus 1 includes a transmitting area TA that is at least partially surrounded by the display area DA. In an exemplary embodiment of the present disclosure, in FIG. 1, the transmitting area TA is entirely surrounded by the display area DA. The non-display area NDA may include a first non-display area NDA1 surrounding the transmitting area TA and being disposed between the transmitting area and the display area DA, and a second non-display area NDA2 surrounding an outer portion of the display area DA. The first non-display area NDA1 may entirely surround the transmitting area TA, the display area DA may entirely surround the first non-display area NDA1, and the second non-display area NDA2 may entirely surround the display area DA.

Although an organic light-emitting display apparatus is described as the display apparatus 1 according to an exemplary embodiment of the present disclosure, the display apparatus 1 of the present disclosure is not necessarily limited thereto. According to an exemplary embodiment of the present disclosure, any of various types of display apparatuses such as an inorganic electroluminescent (EL) display (inorganic light-emitting display) or a quantum dot light-emitting display may be used.

Figure 2:
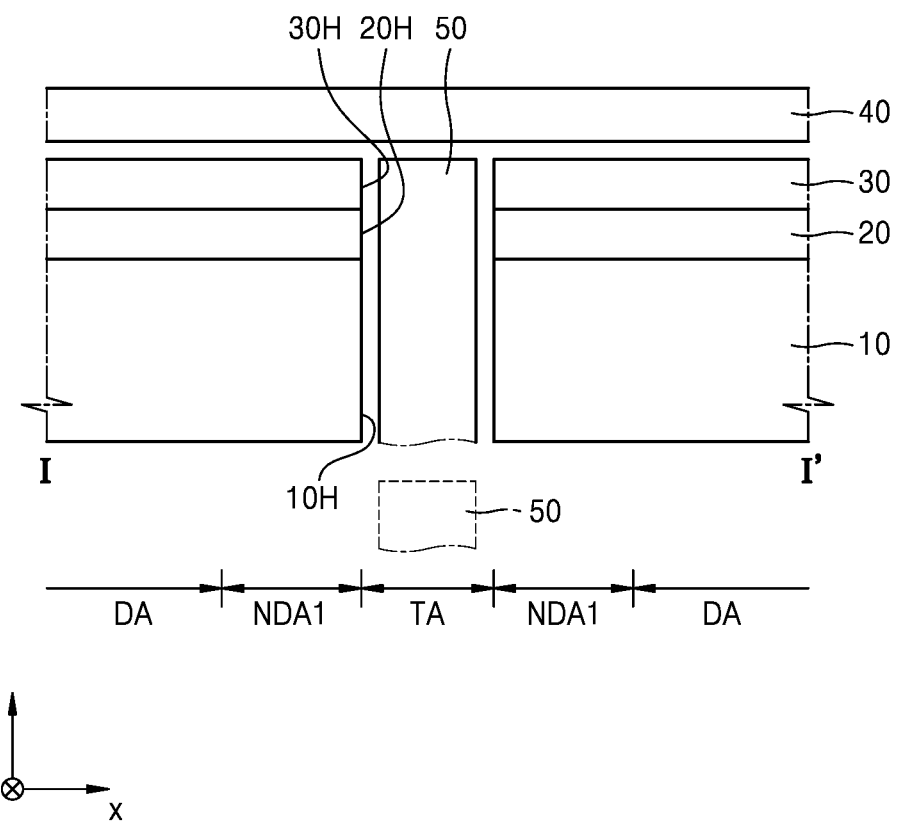
FIG. 2 is a cross-sectional view illustrating a display apparatus according to an exemplary embodiment of the present disclosure.

FIG. 2 is a cross-sectional view taken along line I-I of the display apparatus of FIG. 1 according to an exemplary embodiment of the present disclosure.

Referring to FIG. 2, the display apparatus 1 (see FIG. 1) may include a display panel 10, and an input sensing member 20, and an optical functional member 30 disposed on the display panel 10. The display panel 10, the input sensing member 20, and the optical functional member 30 may all be covered by a window 40. The display apparatus 1 may be any of various electronic devices such as a mobile phone, a laptop computer or a notebook computer, or a smart watch.

The display panel 10 may display an image. The display panel 10 includes pixels disposed in the display area DA. The pixels may include a display element and a pixel circuit connected to the display element. The display element may include an organic light-emitting diode, an inorganic light-emitting diode, or a quantum dot light-emitting diode.

The input sensing member 20 obtains coordinate information according to an external input, for example, a touch event. The input sensing member 20 includes a sensing electrode (or a touch electrode) and a trace line connected to the sensing electrode. The input sensing member 20 may be disposed on the display panel 10. The input sensing member 20 may thereby be a touch sensing layer.

The input sensing member 20 may be directly formed on the display panel 10, or may be separately formed and then may be coupled to the display panel 10 through an adhesive layer such as an optically clear adhesive (OCA). For example, the input sensing member 20 may be successively formed after a process of forming the display panel 10. In this case, the adhesive layer might not be disposed between the input sensing member 20 and the display panel 10. Although the input sensing member 20 is disposed between the display panel 10 and the optical functional member 30 in FIG. 2, according to an exemplary embodiment of the present disclosure, the input sensing member 20 may be disposed over the optical functional member 30.

The optical functional member 30 may include an anti-reflection layer. The anti-reflection layer may reduce a reflectance of light (e.g. external light) incident on the display panel 10 that is received through the window 40. The anti-reflection layer may include a phase retarder and a polarizer. The phase retarder may be of a film type or a liquid-crystal coating type, and may include a λ/2 phase retarder (half wave plate) and/or a λ/4 phase retarder (quarter wave plate). The polarizer may also be of a film type or a liquid-crystal coating type. The film-type polarizer may include a stretchable synthetic resin film, and the liquid crystal-type polarizer may include liquid crystals arranged in a certain arrangement. Each of the phase retarder and the polarizer may further include a protective film. The phase retarder and the polarizer themselves or the protective film may be defined as a base layer of the anti-reflection layer.

According to an exemplary embodiment of the present disclosure, the anti-reflection layer may include a black matrix and color filters. The color filters may be arranged by considering colors of light emitted respectively from the pixels of the display panel 10. According to an exemplary embodiment of the present disclosure, the anti-reflection layer may include a destructive interference structure. The destructive interference structure may include a first reflective layer and a second reflective layer disposed on different layers. First reflected light and second reflected light respectively reflected by the first reflective layer and the second reflective layer may be destructively interfered with each other, thereby reducing a reflectance of external light.

The optical functional member 30 may include a lens layer. The lens layer may increase emission efficiency of light emitted from the display panel 10 or may reduce a color deviation. The lens layer may include a layer having a concave or convex lens shape and/or include a plurality of layers having different refractive indexes. The optical functional member 30 may include both the anti-reflection layer and the lens layer, or may include one of the anti-reflection layer and the lens layer.

The display panel 10, the input sensing member 20, and the optical functional member 30 may each have openings. In FIG. 2, the display panel 10, the input sensing member 20, and the optical functional member 30 respectively have first through third openings 10H, 20H, and 30H, and the first through third openings 10H, 20H, and 30H correspond to one another. The first through third openings 10H, 20H, and 30H are formed to correspond to the transmitting area TA. For example, the transmitting area TA may be an area through which light and/or sound output from the component 50 may reach a user or through which ambient light and/or sound may be received by the component 50, and may be an area formed by the first through third openings 10H, 20H, and 30H.

According to an exemplary embodiment of the present disclosure, at least one of the display panel 10, the input sensing member 20, and/or the optical functional member 30 might not have an opening. For example, one or two elements selected from the display panel 10, the input sensing member 20, and the optical functional member 30 might not have an opening, or all of the display panel 10, the input sensing member 20, and the optical functional member 30 might not have an opening.

The component 50 may be disposed to correspond to the transmitting area TA. The component 50 may be disposed in the first through third openings 10H, 201H, and 30H as marked by a solid line of FIG. 2, or may be disposed below the display panel 10 as marked by a dashed line of FIG. 2.

The component 50 may include an electronic element. For example, the component 50 may be an electronic element using light or sound. Examples of the electronic element may include a sensor for receiving and using light such as an infrared sensor, a camera for receiving light and capturing an image, a sensor for outputting and detecting light or sound to measure a distance or recognize a fingerprint, a small lamp for outputting light, and a speaker for outputting sound. When the component 50 is an electronic element using light, the component 50 may use light of various wavelength bands such as visible light, infrared light, and/or ultraviolet light.

According to an exemplary embodiment of the present disclosure, when the display apparatus 1 is used as a smart watch or a vehicle instrument panel, the component 50 may be a member including a clock hand or a needle indicating certain information (e.g., a vehicle speed). When the display apparatus 1 includes a clock hand or a vehicle instrument panel, the component 50 may be externally observed through the window 40, and the window 40 may have an opening corresponding to the transmitting area TA.

The component 50 may include an element (or elements) related to a function of the display panel 10 as described above, or may include an element such as an accessory for enhancing the beauty of the display panel 10.

Figure 3:
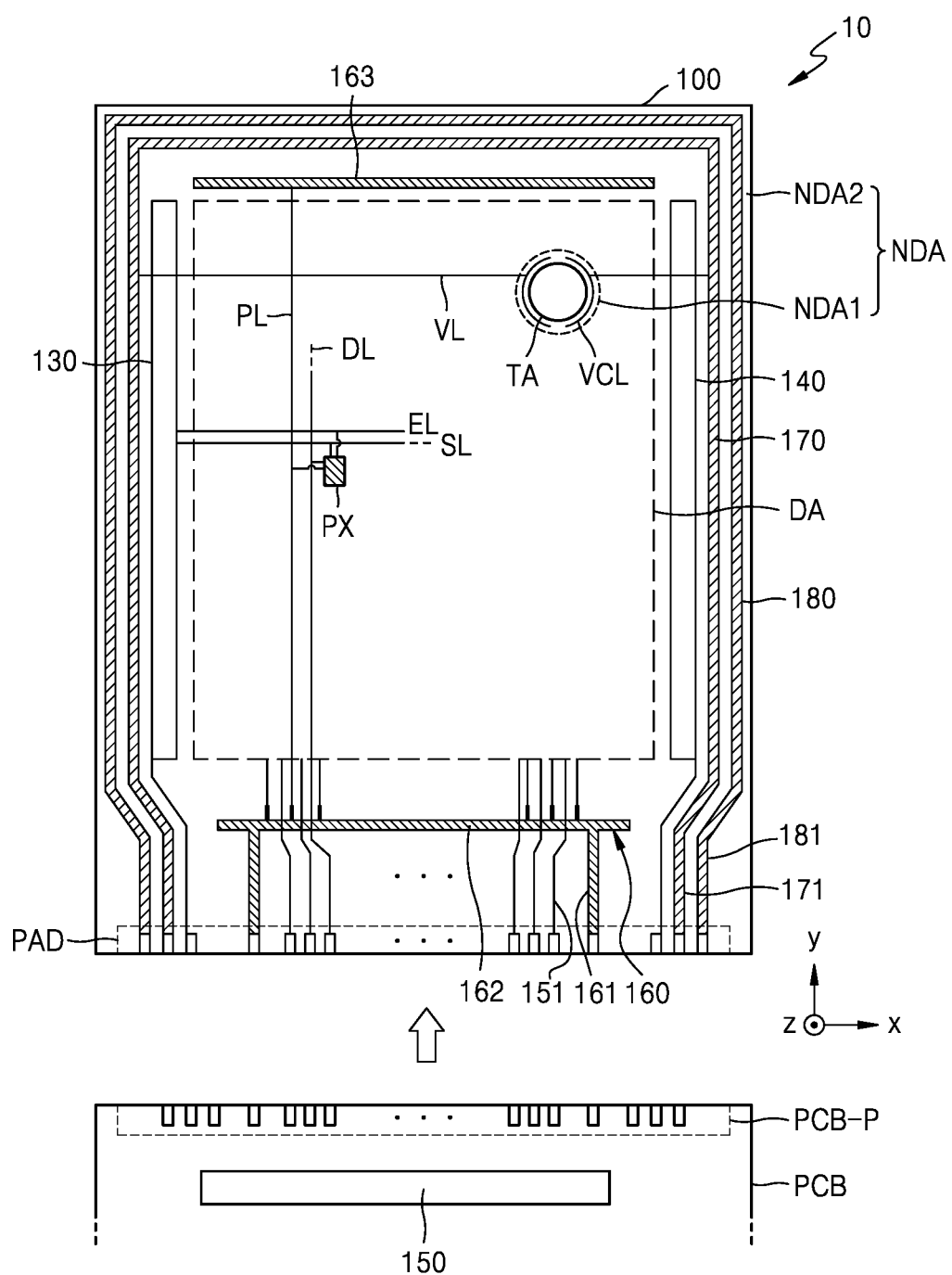
FIG. 3 is a plan view illustrating a display panel according to an exemplary embodiment of the present disclosure.

FIG. 3 is a plan view illustrating a display panel according to an exemplary embodiment of the present disclosure.

Referring to FIG. 3, the display panel 10 includes the display area DA and the non-display area NDA. The non-display area NDA includes the first non-display area NDA1 and the second non-display area NDA2. Because the display panel 10 includes a substrate 100, the substrate 100 may include the transmitting area TA that is previously defined, the display area DA, and the non-display area NDA.

Also, the display panel 10 includes a plurality of pixels PX disposed in the display area DA. Each of the plurality of pixels PX may include a display element such as an organic light-emitting diode OLED. Each pixel PX may emit light, for example, red light, green light, blue light, or white light, through the organic light-emitting diode OLED. Each pixel PX refers to a sub-pixel that emits light of a different color, and each pixel PX may be one of, for example, a red (R) sub-pixel, a green (G) sub-pixel, and a blue (B) sub-pixel. The display area DA may be covered by an encapsulation member and may be protected from external air or moisture thereby.

The first non-display area NDA1 may surround the transmitting area TA. The first non-display area NDA1 is an area where a display element such as an organic light-emitting diode for emitting light is not disposed, and signal lines for applying signals to the pixels PX arranged around the transmitting area TA and connection wirings for applying voltages to the pixels PX arranged around the transmitting area TA may pass through the first non-display area NDA1. For example, as shown in FIG. 3, a connection wiring VCL connected to an initialization voltage line VL may be disposed in the first non-display area NDA1, and the connection wiring VCL may extend along at least a part of an edge of the transmitting area TA. Although the transmitting area TA is disposed on a right portion of the display panel 10 in FIG. 3, the transmitting area TA may be disposed at the center of the display panel 10. Alternatively, the transmitting area TA may be disposed on a left portion of the display panel 10.

Each pixel PX may be electrically connected to outer circuits disposed in the second non-display area NDA2. A first gate driving circuit 130, a second gate driving circuit 140, a pad unit PAD, a driving voltage supply wiring 160, an initialization voltage supply wiring 170, and a common voltage supply wiring 180 may be disposed in the second non-display area NDA2. Each pixel PX may be electrically connected to a data driving circuit 150 through the pad unit PAD.

Each of the first gate driving circuit 130 and the second gate driving circuit 140 may include a scan driving circuit and an emission control driving circuit. The scan driving circuit included in each of the first gate driving circuit 130 and the second gate driving circuit 140 may apply a scan signal to each pixel PX through a scan line SL. Also, the emission control driving circuit included in each of the first gate driving circuit 130 and the second gate driving circuit 140 may apply an emission control signal to each pixel PX through an emission control line EL.

In an exemplary embodiment of the present disclosure, the scan driving circuit included in each of the first gate driving circuit 130 and the second gate driving circuit 140 may be configured to sequentially output a scan signal to the scan line SL in an MC n-clk mode. Here, n is a positive integer. The MC n-clk mode will be described in detail with reference to FIGS. 5 and 6.

The second gate driving circuit 140 may be disposed parallel to the first gate driving circuit 130 with the display area DA disposed therebetween. The pixels PX disposed in the display area DA may be commonly connected to the first gate driving circuit 130 and the second gate driving circuit 140. According to an exemplary embodiment of the present disclosure, some of the pixels PX disposed in the display area DA may be electrically connected to the first gate driving circuit 130, and others of the pixels PX may be connected to the second gate driving circuit 140. According to an exemplary embodiment of the present disclosure, the second gate driving circuit 140 may be omitted.

The pad unit PAD may be disposed on a side of the substrate 100. The pad unit PAD may be exposed without being covered by an insulating layer, and may be electrically connected to a printed circuit board PCB. A terminal portion PCB-P of the printed circuit board PCB may be electrically connected to the pad unit PAD of the display panel 10. The printed circuit board PCB transmits signals and/or power from a controller to the display panel 10.

Control signals generated by the controller may be respectively transmitted to the first and second gate driving circuits 130 and 140 through the printed circuit board PCB. The controller may respectively apply a driving voltage ELVDD (see FIG. 4), an initialization voltage Vint (see FIG. 4), and a common voltage ELVSS (see FIG. 4) to the driving voltage supply wiring 160, the initialization voltage supply wiring 170, and the common voltage supply wiring 180 through first through third bridge wirings 161, 171, and 181. The driving voltage ELVDD is supplied to each pixel PX through a driving voltage line PL connected to the driving voltage supply wiring 160, and the initialization voltage Vint is supplied to each pixel PX through the initialization voltage line VL connected to the initialization voltage supply wiring 170. Also, the common voltage ELVSS may be supplied to a counter electrode 230 (see FIG. 9A) of each pixel PX connected to the common voltage supply wiring 180.

The data driving circuit 150 is electrically connected to a data line DL. A data signal of the data driving circuit 150 may be applied to each pixel PX through a fourth bridge wiring 151 connected to the pad unit PAD and the data line DL connected to the fourth bridge wiring 151. Although the data driving circuit 150 is disposed on the printed circuit board PCB in FIG. 3, according to an exemplary embodiment of the present disclosure, the data driving circuit 150 may be disposed on the substrate 100. For example, the data driving circuit 150 may be disposed between the pad unit PAD and the driving voltage supply wiring 160.

The driving voltage supply wiring 160 may include a first sub-wiring 162 and a second sub-wiring 163 that extend parallel to each other in an x-direction with the display area DA disposed therebetween. Each of the initialization voltage supply wiring 170 and the common voltage supply wiring 180 may partially surround the display area DA in a loop shape with one open side. According to an exemplary embodiment of the present disclosure, the initialization voltage supply wiring 170 may be disposed on the left and right sides of the display area DA.

Figure 4:
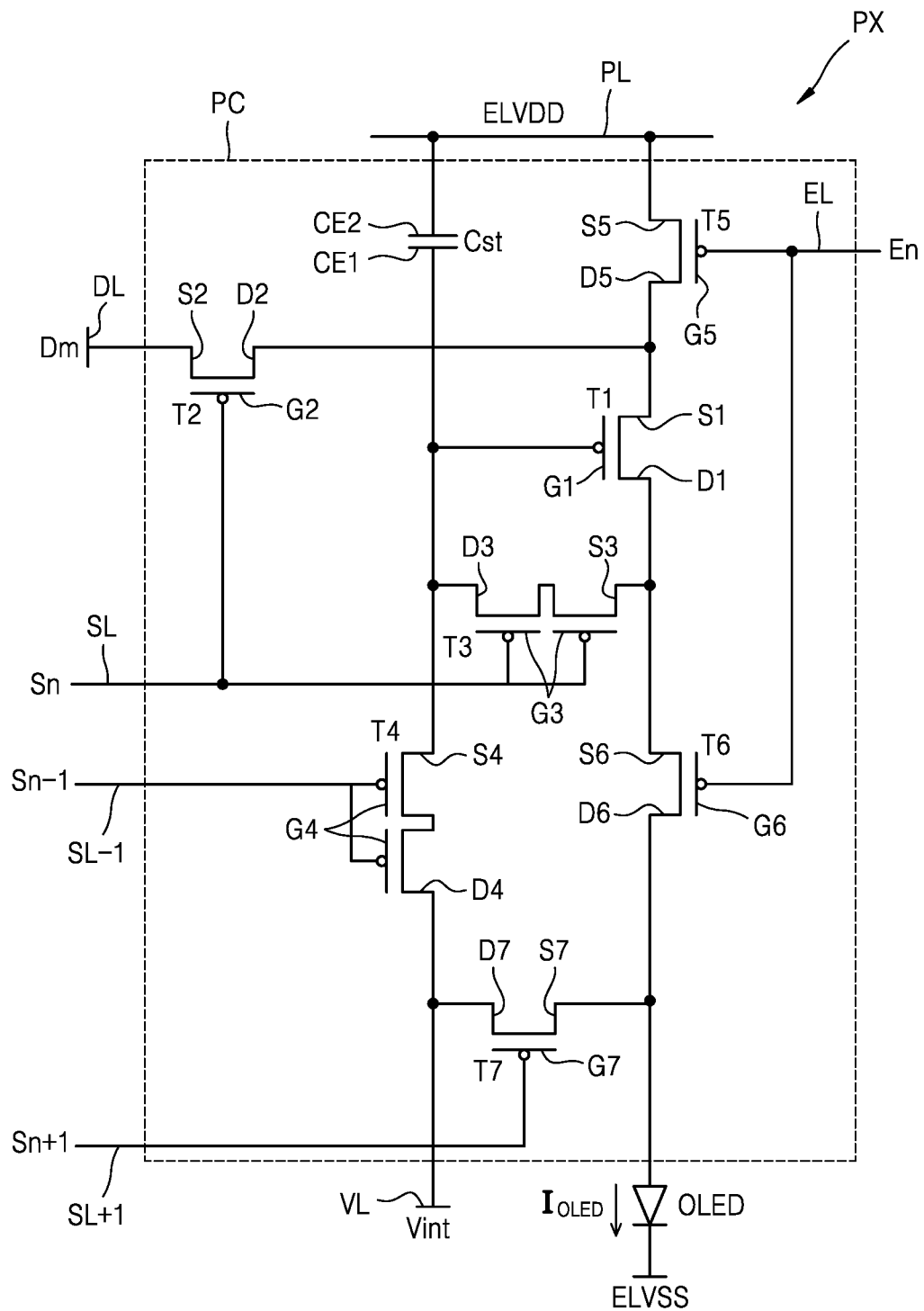
FIG. 4 is an equivalent circuit diagram illustrating a pixel of a display panel according to an exemplary embodiment of the present disclosure.

FIG. 4 is an equivalent circuit diagram illustrating a pixel of a display panel according to an exemplary embodiment of the present disclosure.

Referring to FIG. 4, one pixel PX may include a pixel circuit PC and an organic light-emitting diode OLED electrically connected to the pixel circuit PC.

For example, the pixel circuit PC includes first through seventh thin-film transistors T1 through T7 and a storage capacitor Cst, as shown in FIG. 4. The first to seventh thin-film transistors T1 to T7 and the storage capacitor Cst are connected to first through third scan lines SL, SL−1, and SL+1 for respectively transmitting first through third scan signals Sn, Sn−1, and Sn+1, a data line DL for transmitting a data voltage Dm, an emission control line EL for transmitting an emission control signal En, a driving voltage line PL for transmitting a driving voltage ELVDD, an initialization voltage line VL for transmitting an initialization voltage Vint, and a common electrode to which a common voltage ELVSS is applied.

The first thin-film transistor T1 may be a driving transistor in which an intensity of drain current is determined according to a gate-source voltage, and the second through seventh thin-film transistors T2 through T7 may be switching transistors that are turned on or off according to a gate-source voltage, which may be, for example, a gate voltage.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The storage capacitor Cst is connected between the driving voltage line PL and a driving gate G1 of the driving thin-film transistor T1. The storage capacitor Cst may include an upper electrode CE2 connected to the driving voltage line PL, and a lower electrode CE1 connected to the driving gate G1 of the driving thin-film transistor T1.

The driving thin-film transistor T1 may control an intensity of driving current $I_{OLED}$ flowing from the driving voltage line PL to the organic light-emitting diode OLED according to a gate-source voltage. The driving thin-film transistor T1 may include the driving gate G1 connected to the lower electrode CE1 of the storage capacitor Cst, a driving source S1 connected to the driving voltage line PL through the first emission control thin-film transistor T5, and a driving drain D1 connected to the organic light-emitting diode OLED through the second emission control thin-film transistor T6.

The driving thin-film transistor T1 may output the driving current $I_{OLED}$ to the organic light-emitting diode OLED according to a gate-source voltage. An intensity of the driving current $I_{OLED}$ is determined based on a difference between a threshold voltage and a gate-source voltage of the driving thin-film transistor T1. The organic light-emitting diode OLED may receive the driving current $I_{OLED}$ from the driving thin-film transistor T1, and may emit light at a luminance according to the intensity of the driving current Ioin.

The scan thin-film transistor T2 transmits the data voltage Dm to the driving source S1 of the driving thin-film transistor T1 in response to the first scan signal Sn. The scan thin-film transistor T2 may include a scan gate G2 connected to the first scan line SL, a scan source S2 connected to the data line DL, and a scan drain D2 connected to the driving source S1 of the driving thin-film transistor T1.

The compensation thin-film transistor T3 is connected in series between the driving gate G1 and the driving drain D1 of the driving thin-film transistor T1, and connects the driving gate G1 and the driving drain D1 of the driving thin-film transistor T1 in response to the first scan signal Sn. The compensation thin-film transistor T3 may include a compensation gate G3 connected to the first scan line SL, a compensation source S3 connected to the driving drain D1 of the driving thin-film transistor T1, and a compensation drain D3 connected to the driving gate G1 of the driving thin-film transistor T L. Although the compensation thin-film transistor T3 includes two thin-film transistors that are connected in series to each other as shown in FIG. 4, the compensation thin-film transistor T3 may alternatively include only one thin-film transistor.

The gate initialization thin-film transistor T4 applies the initialization voltage Vint to the driving gate G1 of the driving thin-film transistor T1 in response to the second scan signal Sn−1.

The gate initialization thin-film transistor T4 may include a first initialization gate G4 connected to the second scan line SL−1, a first initialization source S4 connected to the driving gate G1 of the driving thin-film transistor T1, and a first initialization drain D4 connected to the initialization voltage line VL. Although the gate initialization thin-film transistor T4 includes two thin-film transistors that are connected in series to each other as shown in FIG. 4, alternatively the gate initialization thin-film transistor T4 may include only one thin-film transistor.

The anode initialization thin-film transistor T7 applies the initialization voltage Vint to the organic light-emitting diode OLED in response to the third scan signal Sn+1. The anode initialization thin-film transistor T7 may include a second initialization gate G7 connected to the third scan line SL+1, a second initialization source S7 connected to an anode of the organic light-emitting diode OLED, and a second initialization drain D7 connected to the initialization voltage line VL.

The first emission control thin-film transistor T5 may connect the driving source S1 of the driving thin-film transistor T I and the driving voltage line PL in response to the emission control signal En. The first emission control thin-film transistor T5 may include a first emission control gate G5 connected to the emission control line EL, a first emission control source S5 connected to the driving voltage line PL, and a first emission control drain D5 connected to the driving source S1 of the driving thin-film transistor T1.

The second emission control thin-film transistor T6 may connect the anode of the organic light-emitting diode OLED and the driving drain D1 of the driving thin-film transistor T1 in response to the emission control signal En. The second emission control thin-film transistor T6 may include a second emission control gate G6 connected to the emission control line EL, a second emission control source S6 connected to the driving drain D1 of the driving thin-film transistor T1, and a second emission control drain D6 connected to the anode of the organic light-emitting diode OLED.

The second scan signal Sn−1 may be substantially synchronized with the first scan signal Sn of a previous row. The third scan signal Sn+1 may be substantially synchronized with the first scan signal Sn. Alternatively, the third scan signal Sn−1 may be substantially synchronized with the first scan signal Sn of a next row.

According to an exemplary embodiment of the present disclosure, the first through seventh thin-film transistors T1 through T7 may each include a semiconductor layer including silicon. For example, the first through seventh thin-film transistors T1 through T7 may each include a semiconductor layer including low-temperature polysilicon (LTPS). A polysilicon material has a high electron mobility (100 cm$^2$/Vs or more), and thus has low energy consumption and high reliability. Alternatively, semiconductor layers of the first through seventh thin-film transistors T1 through T7 may be formed of amorphous silicon (a-Si). Alternatively, some semiconductor layers of the first through seventh thin-film transistors T1 through T7 may be formed of low-temperature polysilicon (LTPS) and others may be formed of amorphous silicon (a-Si).

A specific operation of one pixel PX of the display panel 10 according to an exemplary embodiment of the present disclosure will now be described. It is assumed that each of the first through seventh thin-film transistors T1 through T7 is a p-type MOSFET as shown in FIG. 4.

First, when the emission control signal En of a high level is received, the first emission control thin-film transistor T5 and the second emission control thin-film transistor T6 are turned off, the driving thin-film transistor T1 stops outputting the driving current $I_{OLED}$, and the organic light-emitting diode OLED stops emitting light.

Next, during a gate initialization period in which the second scan signal Sn−1 of a low level is received, the gate initialization thin-film transistor T4 is turned on, and the initialization voltage Vint is applied to the driving gate G1 of the driving thin-film transistor T1, for example, the lower electrode CE1 of the storage capacitor Cst. A difference (ELVDD−Vint) between the driving voltage ELVDD and the initialization voltage Vint is stored in the storage capacitor Cst.

Next, during a data write period in which the first scan signal Sn of a low level is received, the scan thin-film transistor T2 and the compensation thin-film transistor T3 are turned on, and the data voltage Dm is received by the driving source S1 of the driving thin-film transistor T1. The driving thin-film transistor T1 is diode-connected by the compensation thin-film transistor T3 and is forwardly biased. A gate voltage of the driving thin-film transistor T1 rises from the initialization voltage Vint. When the gate voltage of the driving thin-film transistor T1 is the same as a data compensation voltage (Dm−|Vth|) obtained by subtracting a threshold voltage (Vth) of the driving thin-film transistor T1 from the data voltage Dm, the driving thin-film transistor T1 is turned off and the gate voltage of the driving thin-film transistor T1 stops rising. Accordingly, a difference (ELVDD−Dm+|Vth|) between the driving voltage ELVDD and the data compensation voltage (Dm−|Vth|) is stored in the storage capacitor Cst.

Also, during an anode initialization period in which the third scan signal Sn+1 of a low level is received, the anode initialization thin-film transistor T7 is turned on, and the initialization voltage Vint is applied to the anode of the organic light-emitting diode OLED. Although the pixel PX in a next frame receives the data voltage Dm corresponding to a black grayscale value by applying the initialization voltage Vint to the organic light-emitting diode OLED to completely not emit light, a phenomenon where the organic light-emitting diode OLED emits some light may be eliminated.

The first scan signal Sn and the third scan signal Sn+1 may be substantially synchronized with each other, and in this case, the data write period and the anode initialization period may be the same period.

Next, when the emission control signal En of a low level is received, the first emission control thin-film transistor T5 and the second emission control thin-film transistor T6 may be turned on, the driving thin-film transistor T1 may output the driving current $I_{OLED}$ corresponding to a voltage (ELVDD−Dm) obtained by subtracting the threshold voltage (|Vth|) of the driving thin-film transistor T1 from the voltage stored in the storage capacitor Cst, for example, a source-gate voltage (ELVDD−Dm+|Vth|) of the driving thin-film transistor T1, and the organic light-emitting diode OLED may emit light at a luminance corresponding to the intensity of the driving current $I_{OLED}$.

Figure 5:
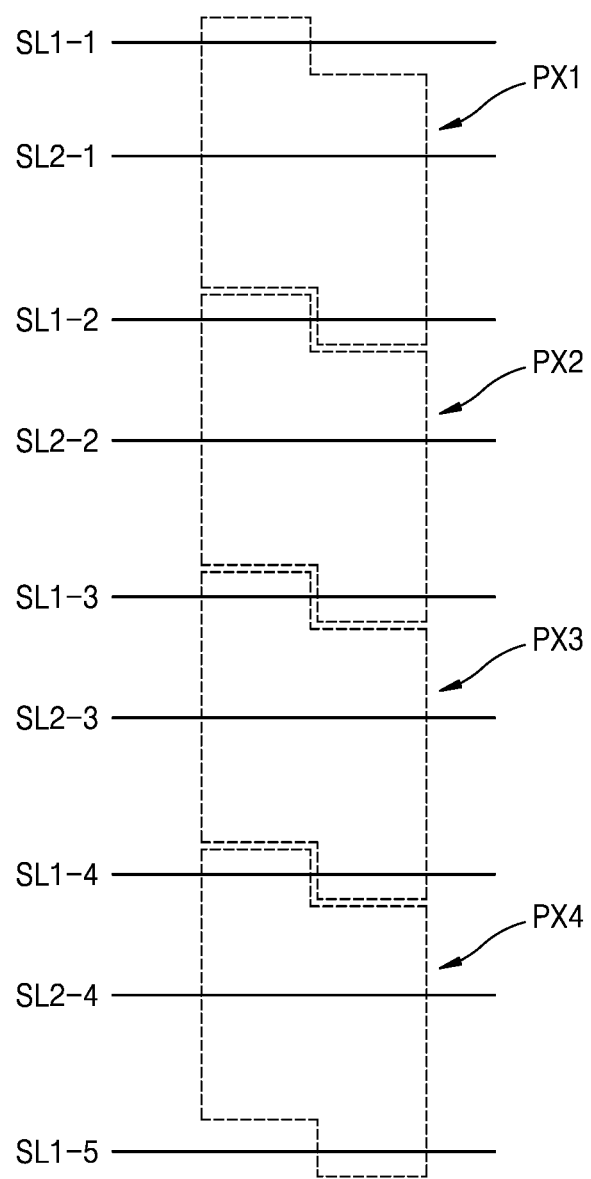
FIG. 5 is an equivalent circuit diagram descry illustrating a method in which a plurality of pixels are driven by a scan signal according to an exemplary embodiment of the present disclosure.
Figure 6:
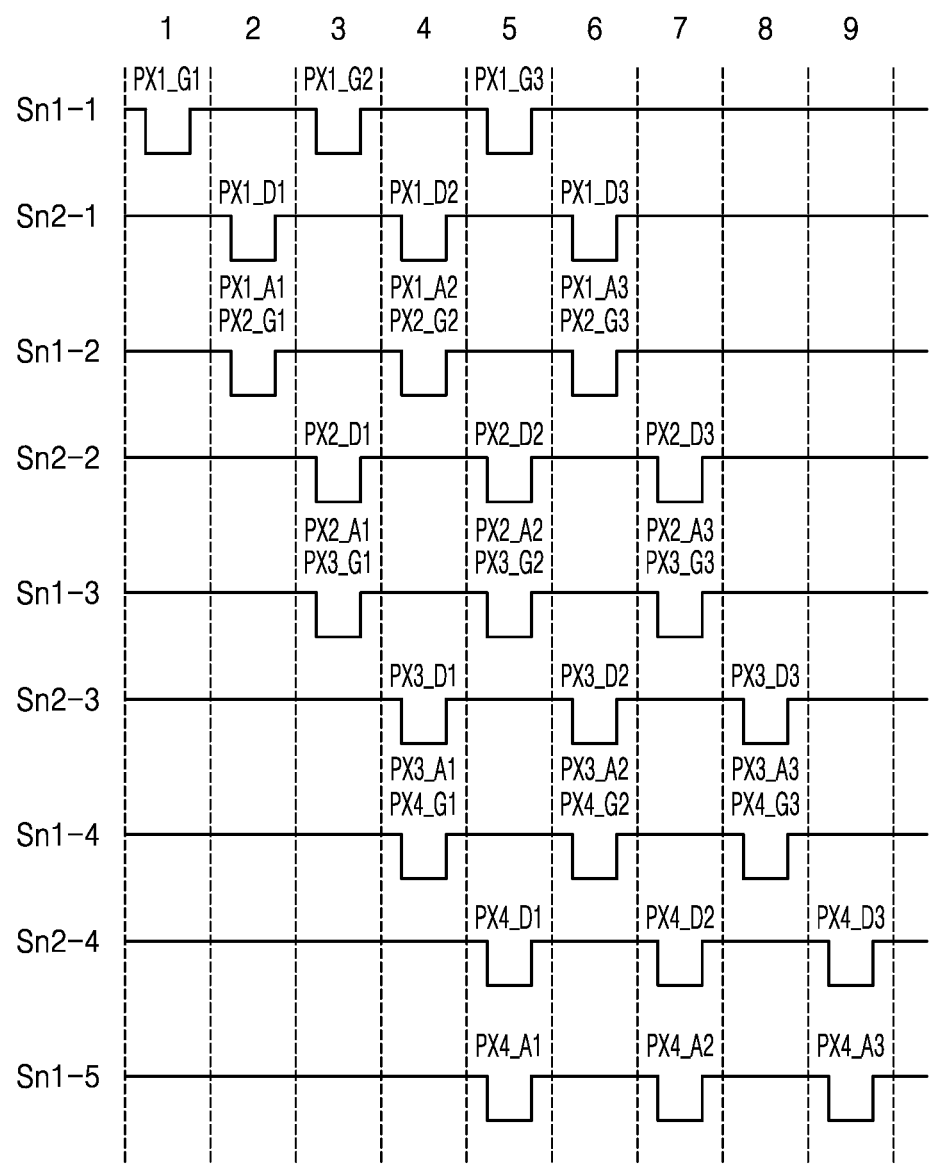
FIG. 6 is a timing diagram illustrating a method in which a plurality of pixels are driven by a scan signal according to an exemplary embodiment of the present disclosure.

FIG. 5 is a diagram illustrating a method in which a plurality of pixels are driven by a scan signal according to an exemplary embodiment of the present disclosure. FIG. 6 is a timing diagram illustrating a method in which a plurality of pixels are driven by a scan signal according to an exemplary embodiment of the present disclosure.

Referring to FIG. 5, the display panel 10 includes the plurality of pixels PX. Although four pixels PX1, PX2, PX3, and PX4 are disposed in the same column in FIG. 5 for easy understanding, the number of pixels PX disposed in the same column may be equal to or greater than 4. Also, the display panel 10 may include a plurality of pixels PX disposed in the same column and a plurality of pixels PX disposed in the same row. For example, the display panel 10 may include a plurality of pixels PX arranged in a row direction and a column direction, and the plurality of pixels PX may be arranged in a matrix.

The first pixel PX1 is connected to a $1\text{-}1^{th}$ scan line SL1−1, a $2\text{-}1^{th}$ scan line SL2−1, and a $1\text{-}2^{th}$ scan line SL1−2. The $1\text{-}1^{th}$ scan line SL1−1, the $2\text{-}1^{th}$ scan line SL2−1, and the $1\text{-}2^{th}$ scan line SL1−2 respectively transmit a $1\text{-}1^{th}$ scan signal Sn1−1, a $2\text{-}1^{th}$ scan signal Sn2−1, and a $1\text{-}2^{th}$ scan signal Sn1−2 to the first pixel PX1. The $1\text{-}1^{th}$ scan line SL1−1 corresponds to the second scan line SL−1 of FIG. 4, the $2\text{-}1^{th}$ scan line SL2−1 corresponds to the first scan line SL of FIG. 4, and the $1\text{-}2^{th}$ scan line SL1−2 corresponds to the third scan line SL+1 of FIG. 4.

A second pixel PX2 is connected to the $1\text{-}2^{th}$ scan line SL1−2, a $2\text{-}2^{th}$ scan line SL2−2, and a $1\text{-}3^{th}$ scan line SL1−3. The $1\text{-}2^{th}$ scan line SL1−2 is also connected to the first pixel PX1 disposed in a previous row as described above. The $1\text{-}2^{th}$ scan line SL1−2, the $2\text{-}2^{th}$ scan line SL2−2, and the $1\text{-}3^{th}$ scan line SL1−3 respectively transmit the $1\text{-}2^{th}$ scan signal Sn1−2, a $2\text{-}2^{th}$ scan signal Sn2−2, and a $1\text{-}3^{th}$ scan signal Sn1−3 to the second pixel PX2. The $1\text{-}2^{th}$ scan signal Sn1−2 may be substantially synchronized with the 2-1th scan signal Sn2−1 of a previous row. The $1\text{-}2^{th}$ scan line SL1−2 corresponds to the second scan line SL−1 of FIG. 4, the $2\text{-}2^{th}$ scan line SL2−2 corresponds to the first scan line SL of FIG. 4, and the $1\text{-}3^{th}$ scan line SL1−3 corresponds to the third scan line SL+1 of FIG. 4. This is a result obtained by corresponding the second pixel PX2 to the pixel PX of FIG. 4, aside from the first pixel PX1.

The third pixel PX3 is connected to the $1\text{-}3^{th}$ scan line SL1−3, a $2\text{-}3^{th}$ scan line SL2−3, and a $1\text{-}4^{th}$ scan line SL−4. The $1\text{-}3^{th}$ scan line SL1−3 is also connected to the second pixel PX2 disposed in a previous row as described above. The $1\text{-}3^{th}$ scan line SL1−3, the $2\text{-}3^{th}$ scan line SL2−3, and the $1\text{-}4^{th}$ scan line SL1−4 respectively transmit the $1\text{-}3^{th}$ scan signal Sn1−3, a $2\text{-}3^{th}$ scan signal Sn2−3, and a $1\text{-}4^{th}$ scan signal Sn1−4 to the third pixel PX3. The $1\text{-}3^{th}$ scan signal Sn1−3 may be substantially synchronized with the $2\text{-}2^{th}$ scan signal Sn2−2 of a previous row. The $1\text{-}3^{th}$ scan line SL1−3 corresponds to the second scan line SL−1 of FIG. 4, the $2\text{-}3^{th}$ scan line SL2−3 corresponds to the first scan line SL of FIG. 4, and the $1\text{-}4^{th}$ scan line SL1−4 corresponds to the third scan line SL+1 of FIG. 4. This is a result obtained by corresponding the third pixel PX3 to the pixel PX of FIG. 4, aside from the first pixel PX1 and the second pixel PX2.

The fourth pixel PX4 is connected to the $1\text{-}4^{th}$ scan line SL1−4, a $2\text{-}4^{th}$ scan line SL2−4, and a $1\text{-}5^{th}$ scan line SL1−5. The $1\text{-}4^{th}$ scan line SL1−4 is also connected to the third pixel PX3 disposed in a previous row as described above. The $1\text{-}4^{th}$ scan line SL1−4, the $2\text{-}4^{th}$ scan line SL2−4, and the $1\text{-}5^{th}$ scan line SL1−5 respectively transmit the $1\text{-}4^{th}$ scan signal Sn1−4, a $2\text{-}4^{th}$ scan signal Sn2−4, and a $1\text{-}5^{th}$ scan signal Sn1−5 to the fourth pixel PX4. The $1\text{-}4^{th}$ scan signal Sn1−4 may be substantially synchronized with the $2\text{-}3^{th}$ scan signal Sn2−3 of a previous row. The $1\text{-}4^{th}$ scan line SL1−4 corresponds to the second scan line SL−1 of FIG. 4, the $2\text{-}4^{th}$ scan line SL2−4 corresponds to the first scan line SL of FIG. 4, and the $1\text{-}5^{th}$ scan line SL1−5 corresponds to the third scan line SL+1 of FIG. 4. This is a result obtained by corresponding the fourth pixel PX4 to the pixel PX of FIG. 4, aside from the first through third pixels PX1, PX2, and PX3.

In an exemplary embodiment of the present disclosure, as described with reference to FIG. 3, the first and second gate driving circuits 130 and 140 may be configured to sequentially output scan signals to a plurality of scan lines in an MC n-clk mode (where n is a positive integer). The plurality of scan lines may respectively transmit n scan signals to the plurality of pixels PX during one frame.

In general, operation characteristics of a thin-film transistor for driving the organic light-emitting diode OLED are different when a black image is displayed and when a white image is displayed. Accordingly, when the black image is switched to the white image, a luminance does not immediately change, but rather changes gradually in a stepwise manner over several frames. A ratio of a luminance in a first frame to a full white luminance is referred to as step efficiency (S/E), and display quality increases as the S/E increases. The S/E decreases due to hysteresis characteristics of the thin-film transistor. Accordingly, a scan signal of an MC n-clk mode may be used to compensate for the decreased S/E.

FIG. 6 illustrates that the first and second gate driving circuits 130 and 140 are configured to sequentially output scan signals to a plurality of scan lines in an MC 3-clk mode (where n is 3). An operation of the pixel PX in an MC n-clk mode may be inferred and analyzed based on the MC 3-clk mode.

First, each of a plurality of scan lines may transmit three scan signals to each of the plurality of pixels PX during one frame. When three scan signals are transmitted to each of the plurality of pixels PX during one frame, it may mean that a scan signal of a low level is transmitted to each of the plurality of pixels PX three times during one frame. For example, the 1-1$^{th}$ scan line SL1-1 connected to the first pixel PX1 transmits the first scan signal Sn1-1 of a low level to the first pixel PX1 in a first interval, a third interval, and a fifth interval. Also, the 2-1$^{th}$ scan line SL2-1 connected to the first pixel PX1 transmits the 2-1$^{th}$ scan signal Sn2-1 of a low level to the first pixel PX1 in a second interval, a fourth interval, and a sixth interval. For example, the first pixel PX1 alternately receives three 1-1$^{th}$ scan signals Sn1-1 and three 2-1$^{th}$ scan signals Sn2-1.

A specific gate and/or anode initialization process of the plurality of pixels PX according to an exemplary embodiment of the present disclosure will be described in detail for each interval with reference to FIG. 6.

The first interval corresponds to a first gate initialization period PX1_G1 in which the 1-1$^{th}$ scan signal Sn1-1 of a first low level is received by the first pixel PX1.

As described with reference to FIG. 4, during the first gate initialization period PX1_IG1 in which the 1-1$^{th}$ scan signal Sn1-1 of the first low level is received by the first pixel PX1, the gate initialization thin-film transistor T4 of the first pixel PX1 connected to the 1-1$^{th}$ scan line SL1-1 corresponding to the second scan line SL-1 is turned on. Accordingly, the initialization voltage Vint is applied to a gate of the driving thin-film transistor T1 of the first pixel PX1.

The second interval corresponds to a first data write period PX1_D1 in which the 2-1$^{th}$ scan signal Sn2-1 of a first low level is received by the first pixel PX1, a first anode initialization period PX1_A1 in which the 1-2$^{th}$ scan signal Sn1-2 of a first low level is received by the first pixel PX1, and a first gate initialization period PX2_G1 in which the 1-2$^{th}$ scan signal Sn1-2 of the first low level is received by the second pixel PX2.

As described above, after the first interval, during the first data write period PX1_D1 in which the 2-1$^{th}$ scan signal Sn2-1 of the first low level is received by the first pixel PX1, the scan thin-film transistor T2 and the compensation thin-film transistor T3 of the first pixel PX1 respectively connected to the 2-1$^{th}$ scan line SL2-1 corresponding to the first scan line SL1 are turned on. Accordingly, the data voltage Dm is transmitted as a data compensation voltage (Dm-|Vth|) to the lower electrode CE1 of the storage capacitor Cst through the scan thin-film transistor T2, the driving thin-film transistor T1, and the compensation thin-film transistor T3 of the first pixel PX1.

Also, during the first anode initialization period PX1_A1 in which the 1-2$^{th}$ scan signal Sn1-2 of the first low level is received by the first pixel PX1, the anode initialization thin-film transistor T7 of the first pixel PX1 connected to the 1-2$^{th}$ scan line SL1-2 corresponding to the third scan line SL+1 is turned on. Accordingly, the initialization voltage Vint is applied to an anode of the organic light-emitting diode OLED of the first pixel PX1. As such, the 2-1$^{th}$ scan signal Sn2-1 and the 1-2$^{th}$ scan signal Sn1-2 may be substantially synchronized with each other, and in this case, the data write period of the first pixel PX1 and the anode initialization period of the first pixel PX1 may be the same period.

Also, during the first gate initialization period PX2_G1 in which the 1-2$^{th}$ scan signal Sn1-2 of the first low level is received by the second pixel PX2, the gate initialization thin-film transistor T4 of the second pixel PX2 connected to the 1-2$^{th}$ scan line SL1-2 corresponding to the second scan line SL-1 is turned on. Accordingly, the initialization voltage Vint is applied to the gate of the driving thin-film transistor T1 of the second pixel PX2. As such, the 2-1$^{th}$ scan signal Sn2-1 and the 1-2$^{th}$ scan signal Sn1-2 may be substantially synchronized with each other, and in this case, the anode initialization period of the first pixel PX1 and the gate initialization period of the second pixel PX2 may be the same period.

The third interval corresponds to a second gate initialization period PX1_G2 in which the 1-1$^{th}$ scan signal Sn1-1 of a second low level is received by the first pixel PX1, a first data write period PX2_D1 in which the 2-2$^{th}$ scan signal Sn2-2 of a first low level is received by the second pixel PX2, a first anode initialization period PX2_A1 in which the 1-3th scan signal Sn1-3 of a first low level is received by the second pixel PX2, and a first gate initialization period PX3.G1 in which the 1-3$^{th}$ scan signal Sn1-3 of a first low level is received by the third pixel PX3.

After the second interval, during the second gate initialization period PX1_G2 in which the 1-1$^{th}$ scan signal Sn1-1 of the second low level is received by the first pixel PX1, the gate initialization thin-film transistor T4 of the first pixel PX1 is turned on, and the initialization voltage Vint is applied to the gate of the driving thin-film transistor T1 of the first pixel PX1. During the second data write period PX2-D1 in which the 2-2$^{th}$ scan signal Sn2-2 of the first low level is received by the second pixel PX2, the scan thin-film transistor T2 and the compensation thin-film transistor T3 of the second pixel PX2 are turned on, and the data voltage Dm is stored in the storage capacitor Cst of the second pixel PX2.

Also, during the first anode initialization period PX2_A1 in which the 1-3$^{th}$ scan signal Sn1-3 of the first low level is received by the second pixel PX2, the anode initialization thin-film transistor T7 of the second pixel PX2 is turned on, and the initialization voltage Vint is applied to the anode of the organic light-emitting diode OLED of the second pixel PX2. During the first gate initialization period PX3_G1 in which the 1-3$^{th}$ scan signal Sn1-3 of the first low level is received by the third pixel PX3, the gate initialization thin-film transistor T4 of the third pixel PX3 is turned on, and the initialization voltage Vint is applied to the gate of the driving thin-film transistor T1 of the third pixel PX3. As such, the gate initialization period of the first pixel PX1, the anode initialization period of the second pixel PX2, and the gate initialization period of the third pixel PX3 may be the same period.

The fourth interval corresponds to a second data write period PX1_D2 in which the 2-1$^{th}$ scan signal Sn2-1 of a second low level is received by the first pixel PX1, a second anode initialization period PX1_A2 in which the 1-2$^{th}$ scan signal Sn1-2 of a second low level is received by the first pixel PX1, a second gate initialization period PX2_G2 in which the 1-2$^{th}$ scan signal Sn1-2 of the second low level is received by the second pixel PX2, a first data write period PX3_D1 in which the 2-3$^{th}$ scan signal Sn2-3 of a first low level is received by the third pixel PX3, a first anode initialization period PX3_A1 in which the 1-4$^{th}$ scan signal Sn1-4 of a first low level is received by the third pixel PX3, and a first gate initialization period PX4_G1 in which the 1-4$^{th}$ scan signal Sn1-4 of the first low level is received by the fourth pixel PX4. A specific operation of each period is the same as that described above.

As shown in the fourth interval, the anode initialization period of the first pixel PX1, the gate initialization period of the second pixel PX2, the anode initialization period of the third pixel PX3, and the gate initialization period of the fourth pixel PX4 may be the same period. The number of pixels corresponding to a gate/anode initialization period in the interval 4 is greater than that in the first through third intervals due to the MC 3-clk driving mode.

The fifth interval corresponds to a third gate initialization period PX1_G3 in which the 1-1$^{th}$ scan signal Sn1–1 of a third low level is received by the first pixel PX1, a second data write period PX2_D2 in which the 2-2$^{th}$ scan signal Sn2–2 of a second low level is received by the second pixel PX2, a second anode initialization period PX2 A2 in which the 1-3$^{th}$ scan signal Sn1–3 of a second low level is received by the second pixel PX2, a second gate initialization period PX3_G2 in which the 1-3$^{th}$ scan signal Sn1–3 of the second low level is received by the third pixel PX3, a first data write period PX4_D1 in which the 2-4$^{th}$ scan signal Sn2–4 of a first low level is received by the fourth pixel PX4, and a first anode initialization period PX4_A1 in which the 1-5$^{th}$ scan signal Sn1–5 of a first low level is received by the fourth pixel PX4.

As shown in the fifth interval, the gate initialization period of the first pixel PX1, the anode initialization period of the second pixel PX2, the gate initialization period of the third pixel PX3, and the anode initialization period of the fourth pixel PX4 may be the same period.

The sixth interval corresponds to a third data write period PX_D3 in which the 2-1$^{th}$ scan signal Sn2–1 of a third low level is received by the first pixel PX1, a third anode initialization period PX1 A3 in which the 1-2$^{th}$ scan signal Sn1–2 of a third low level is received by the first pixel PX1, a third gate initialization period PX2_G3 in which the 1-2$^{th}$ scan signal Sn1–2 of the third low level is received by the second pixel PX2, a second data write period PX3_D2 in which the 2-3$^{th}$ scan signal Sn2–3 of a second low level is received by the third pixel PX3, a second anode initialization period PX3_A2 in which the 1-4$^{th}$ scan signal Sn1–4 of a second low level is received by the third pixel PX3, and a second gate initialization period PX4_G2 in which the 1-4$^{th}$ scan signal Sn-4 of a second low level is received by the fourth pixel PX4.

As shown in the sixth interval, the anode initialization period of the first pixel PX1, the gate initialization period of the second pixel PX2, the anode initialization period of the third pixel PX3, and the gate initialization period of the fourth pixel PX4 may be the same period. Also, a gate/anode initialization period of the first pixel PX1 due to the MC 3-clk driving mode corresponds to the first through sixth intervals. In an MC n-clk driving mode, a gate/anode initialization period of one pixel corresponds to first through 2n$^{th}$ intervals.

A seventh interval corresponds to a second data write period PX2_D3 in which the 2-2$^{th}$ scan signal Sn2–2 of a third low level is received by the second pixel PX2, a third anode initialization period PX2 A3 in which the 1-3$^{th}$ scan signal Sn1–3 of a third low level is received by the second pixel PX2, a third gate initialization period PX3_G3 in which the 1-3$^{th}$ scan signal Sn1–3 of the third low level is received by the third pixel PX3, a second data write period PX4_D2 in which the 2-4$^{th}$ scan signal Sn2–4 of a second low level is received by the fourth pixel PX4, and a second anode initialization period PX4_A2 in which the 1-5$^{th}$ scan signal Sn1–5 of a second low level is received by the fourth pixel PX4. As such, a gate/anode initialization period of the second pixel PX2 due to the MC 3-clk driving mode corresponds to the second through seventh intervals. In an MC n-clk driving mode, a gate/anode initialization period of one pixel corresponds to k$^{th}$ through (k+2n−1)$^{th}$ intervals. Here, k is a positive integer.

An eighth interval corresponds to a third data write period PX3_D3 in which the 2-3$^{th}$ scan signal Sn2–3 of a third low level is received by the third pixel PX3, a third anode initialization period PX3_A3 in which the 1-4$^{th}$ scan signal Sn1–4 of a third low level is received by the third pixel PX3, and a third gate initialization period PX4_G3 in which the 1-4$^{th}$ scan signal Sn1–4 of the third low level is received by the fourth pixel PX4. As such, a gate/anode initialization period of the third pixel PX3 due to the MC 3-clk driving mode corresponds to the third through eighth intervals.

A ninth interval corresponds to a third data write period PX4_D3 in which the 2-4$^{th}$ scan signal Sn2–4 of a third low level is received by the fourth pixel PX4, and a third anode initialization period PX4_A3 in which the 1-5$^{th}$ scan signal Sn1–5 of a third low level is received by the fourth pixel PX4. As such, a gate/anode initialization period of the fourth pixel PX4 due to the MC 3-clk driving mode corresponds to the fourth through ninth intervals.

Figure 7:
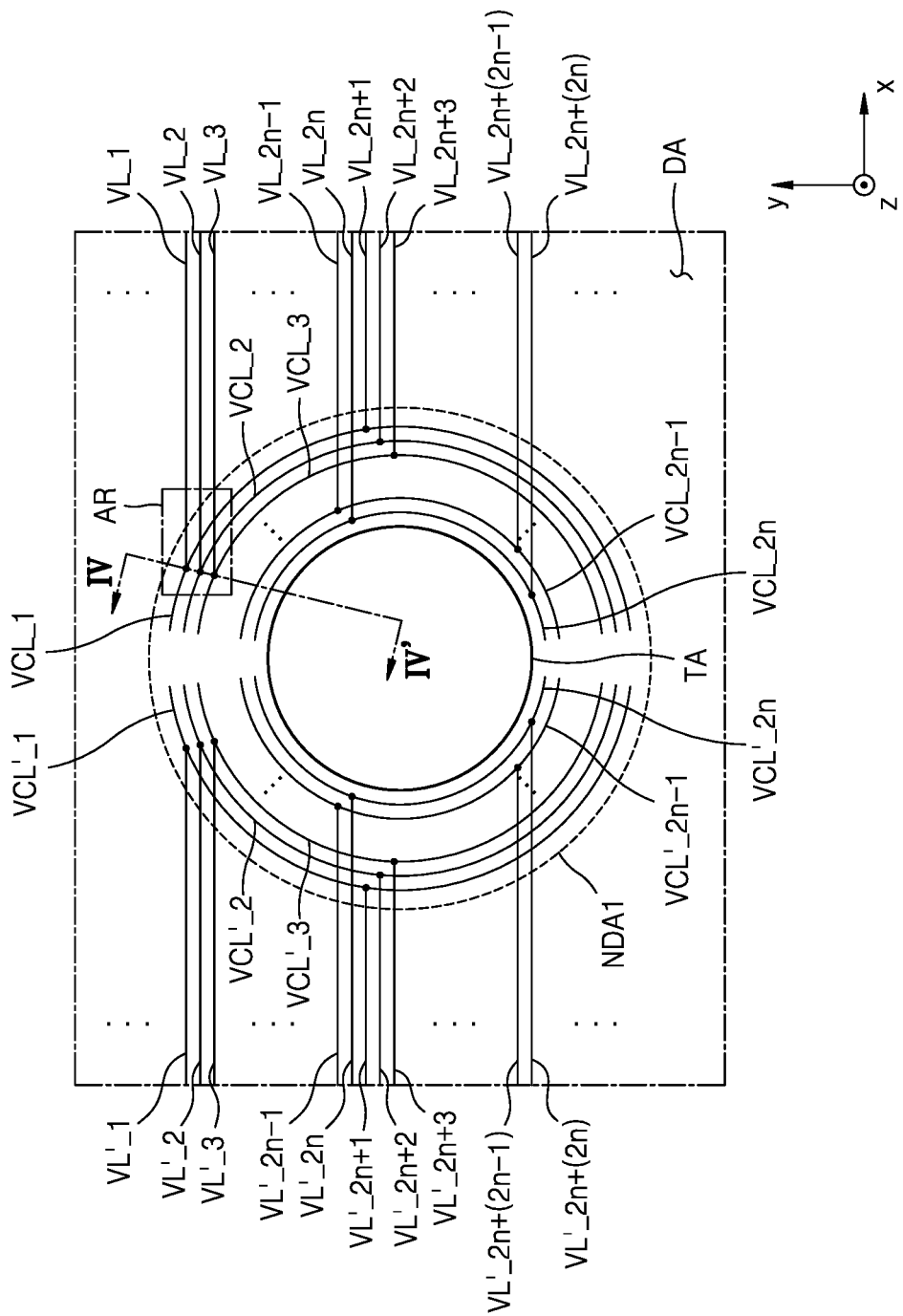
FIG. 7 is a plan view illustrating a plurality of voltage wirings and a plurality of connection wirings of a display panel according to an exemplary embodiment of the present disclosure.

FIG. 7 is a view illustrating a plurality of voltage wirings and a plurality of connection wirings of a display panel according to an exemplary embodiment of the present disclosure.

Referring to FIG. 7, the display panel 10 includes the transmitting area TA, the display area DA surrounding the transmitting area TA, and the first non-display area NDA1 between the transmitting area TA and the display area DA. Also, the display panel 10 includes the plurality of pixels PX arranged in the display area DA, a plurality of connection wirings VCL and VCL' disposed in the first display area NDA1 and extending along at least a part of an edge of the transmitting area TA, and a plurality of voltage wirings VL and VL' extending in a first direction (x) and connected to at least some of the pixels PX disposed in the same row from among the plurality of pixels PX.

One end of each of the plurality of voltage wirings VL and VL' may be connected to one of the plurality of connection wirings VCL and VCL', and the other end of each of the plurality of voltage wirings VL and VL may be connected to the initialization voltage supply wiring 170 (see FIG. 3) disposed in the second non-display area NDA2 (see FIG. 3). The plurality of voltage wirings VL and VL' may correspond to the initialization voltage line VL (see FIGS. 3 and 4).

The plurality of connection wirings VCL and VCL' may include a plurality of first connection wirings VCL and a plurality of second connection wirings VCL' disposed on opposite sides of the transmitting area TA. The plurality of first connection wirings VCL may be spaced apart from the plurality of second connection wirings VCL'. Also, the plurality of voltage wirings VL and VL' may include a plurality of first voltage wirings VL and a plurality of second voltage wirings VL' spaced apart from each other by the transmitting area TA. Each of the plurality of first voltage wirings VL may be respectively connected to one of the plurality of first connection wirings VCL, and each of the plurality of second voltage wirings VL' may be connected to one of the plurality of second connection wirings VCL'. Although the plurality of first connection wirings VCL and the plurality of second connection wirings VCL' are shown to be spaced apart from each other in FIG. 7, according to an exemplary embodiment of the present disclosure, the plurality of first connection wirings VCL and the plurality of second connection wirings VCL' may be connected to each other in a one-to-one manner.

In an exemplary embodiment of the present disclosure, as described with reference to FIGS. 3 and 6, a scan driving circuit included in each of the first gate driving circuit 130 and the second gate driving circuit 140 may be configured to sequentially output scan signals to the scan lines SL in an MC n-clk mode.

In this case, the number of the plurality of first connection wiring VCL may be 2n, first through 2n$^{th}$ first voltage wirings VL_1, VL_2, VL_3, . . . , VL_2n−1, and VL_2n from among the plurality of first voltage wirings VL may be connected in a one-to-one manner to 2n first connection wirings VCL_1, VCL_2, VCL_3, . . . , VCL_2n−1, and VCL_2n according to a predetermined order.

Also, the first connection wiring VCL connected to an $i^{th}$ first voltage wiring VL_i from among the plurality of first voltage wirings VL from among the 2n first connection wirings VCL_1, VCL_2, VCL_3, . . . , VCL_2n−1, and VCL_2n may be the same as the first connection wiring VCL connected to a $(2n+i)^{th}$ first voltage wiring VL_2n+i from among the plurality of first voltage wirings VL from among the 2n first connection wirings VCL_1, VCL_2, VCL_3, . . . , VCL_2n−1, and VCL_2n. Here, i is a positive integer.

For example, the first-first voltage wiring VL_1 may be connected to the first-first connection wiring VCL_1, the second-first voltage wiring VL_2 may be connected to the second-first connection wiring VCL_2, the third-first voltage wiring VL_3 may be connected to the third-first connection wiring VCL_3, the $(2n-1)^{th}$ first voltage wiring VL_2n−1 may be connected to the $(2n-1)^{th}$ first connection wiring VCL_2n−1, and the $2n^{th}$ first voltage wiring VL_2n may be connected to the $2n^{th}$ first connection wiring VCL_2n.

A $(2n+1)^{th}$ first voltage wiring VL_2n+1 may be connected to the first-first connection wiring VCL_1 like the first-first voltage wiring VL_1, a $(2n+2)^{th}$ first voltage wiring VL_2n+2 may be connected to the second-first connection wiring VCL_2 like the second-first voltage wiring VL_2, a $(2n+3)^{th}$ first voltage wiring VL_2n+3 may be connected to the third-first connection wiring VCL_3 like the third-first voltage wiring VL_3, a $(2n+2n-1)^{th}$ first voltage wiring VL_2n+(2n−1) may be connected to the $(2n-1)^{th}$ first connection wiring VCL_2n−1 like the $(2n-1)^{th}$ first voltage wiring VL_2n−1, and a $(2n+2n)^{th}$ first voltage wiring VL_2n+(2n) may be connected to the $2n^{th}$ first connection wiring VCL_2n like the $2n^{tb}$ first voltage wiring VL_2n.

Although the plurality of first connection wirings VCL and the plurality of first voltage wirings VL have been described, the description may also apply to the plurality of second connection wirings VCL' and the plurality of second voltage wirings VL'. For example, the number of the plurality of second connection wirings VCL' may be 2n, and first through $2n^{th}$ second voltage wirings VL'_1, VL'_2, VL'_3, . . . , VL'_2n−1, and VL'_2n from among the plurality of second voltage wirings VL' may be connected in a one-to-one manner to 2n second connection wirings VCL'_1, VCL'_2, VCL'_3, . . . , VCL'_2n−1, and VCL'_2n according to a predetermined order.

As a comparative example, a plurality of voltage wirings might not be connected in a one-to-one manner to a plurality of connection wirings, but may all be connected to a single connection wiring. Also, the plurality of voltage wirings may sequentially perform gate/anode initialization 2n times in an MC n-clk mode. In this case, intervals in which the plurality of voltage wirings perform gate/anode initialization overlap one another, and the plurality of voltage wirings disposed around a transmitting area perform initialization depending on one connection wiring. Because all of the plurality of voltage wirings are connected to one point to perform initialization, an initialization load of each of the plurality of voltage wirings is reduced. Accordingly, upon examining one voltage wiring from among the plurality of voltage wirings, an initialization load is reduced and an initialization voltage drop itself is reduced. As a result, a display area extending in the x-direction from the transmitting area looks brighter than other display areas. A luminance deviation occurs between the display areas.

However, in an exemplary embodiment of the present disclosure, the display panel 10 includes the plurality of connection wirings VCL and VCL' disposed in the first non-display area NDA1 and extending along at least a part of an edge of the transmitting area TA, and the plurality of voltage wirings VL and VL' extending the first direction (x) and connected to at least some of the pixels PX disposed in the same row from among the plurality of pixels PX. Also, the plurality of voltage wirings VL and VL' may be connected in a one-to-one manner to the plurality connection wirings VCL and VCL' according to a predetermined order. For example, the first connection wiring VCL connected to an $i^{th}$ first voltage wiring VL_i from among the plurality of first voltage wirings VL from among 2n first connection wirings VCL_1, VCL_2, VCL_3, . . . , VCL_2n−1, and VCL_2n may be the same as the first connection wiring VCL connected to a $(2n+i)^{th}$ first voltage wiring VL_2n+i from among the plurality of first voltage wirings VL from among the 2n first connection wirings VCL_1, VCL_2, VCL_3, . . . , VCL_2n−1, and VCL_2n. In this case, even when the plurality of voltage wirings VL and VL' sequentially perform gate/anode initialization 2n times due to an MC n-clk mode, initialization loads are substantially the same, and thus a luminance deviation might not occur or at least a luminance deviation may be reduced.

For example, as described with reference to FIG. 6, in an MC n-clk driving mode, a gate/anode initialization period of one pixel corresponds to $k^{th}$ through $(k+2n-1)^{th}$ intervals. Here, k is a positive integer. For example, a gate/anode initialization period of pixels connected to the first-first voltage wiring VL_1 corresponds to first through 2n intervals, and a gate/anode initialization period of pixels connected to the $(2n+1)^{th}$ first voltage wiring VL_2n+1 corresponds to $(2n+1)^{th}$ through $(2n+2n-1)^{th}$ intervals. The gate/anode initialization periods of the pixels connected to the first-first voltage wiring VL_1 and the pixels connected to the $(2n+1)^{th}$ first voltage wiring VL_2n+1 do not overlap each other. Accordingly, even when the first-first voltage wiring VL_1 and the $(2n+1)^{th}$ first voltage wiring (VL_2n+1) are connected to each other, loads of the pixels connected to the first-first voltage wiring (VL_1) and the pixels connected to the $(2n+1)^{th}$ first voltage wiring VL_2n+1 do not overlap each other, and thus there is no change in an initialization load of pixels. As a result, the display area DA (corresponding to a region A and a region B of FIG. 12) extending in the x-direction from the transmitting area TA may have the same luminance as that of other display areas DA (corresponding to a region C of FIG. 12). A luminance deviation between the display areas DA is reduced.

According to an exemplary embodiment of the present disclosure, the display apparatus 1 may include a substrate 100 including a display area DA, an opening TA within the display area DA and a non-display area NDA1 disposed between the opening TA and the display area DA. A plurality of connection wirings VCL and VCL' is disposed in the non-display area NDA1 and at least partially circumscribes the opening TA. A plurality of voltage wirings VL connects each of the connection wirings VCL and VCL' to a corresponding pixel PX within the display area DA.

The plurality of connection wirings VCL and VCL' may include 2n connection wirings, where n is a positive integer. The opening TA may have a substantially curved side. Each of the plurality of connection wirings VCL and VCL' may be curved. Each of the voltage wirings may be straight.

Figure 8:
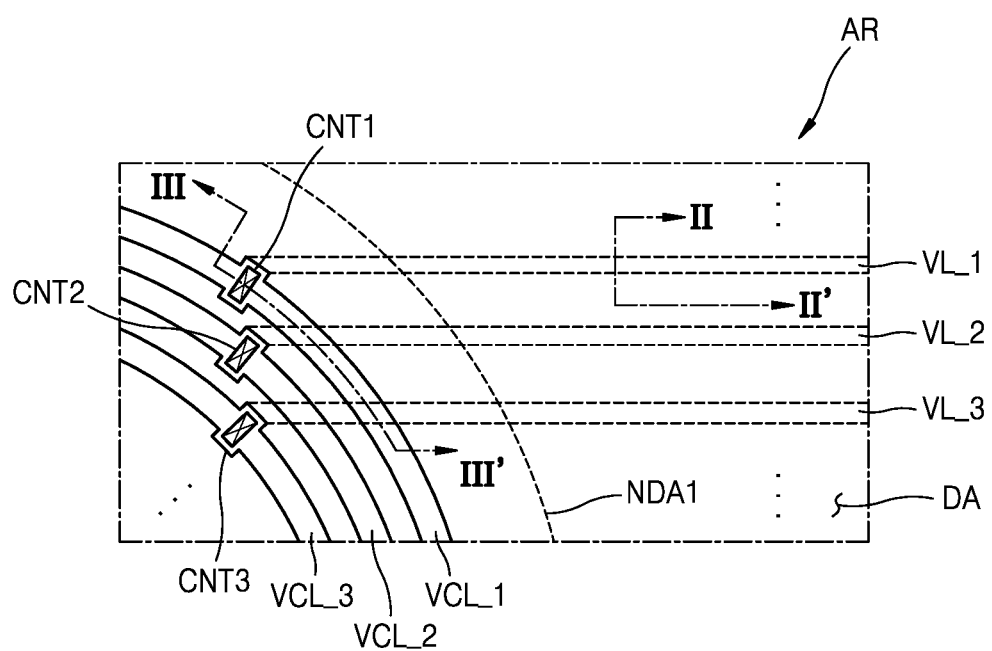
FIG. 8 is an enlarged plan view illustrating a portion of FIG. 7.
Figure 9A:
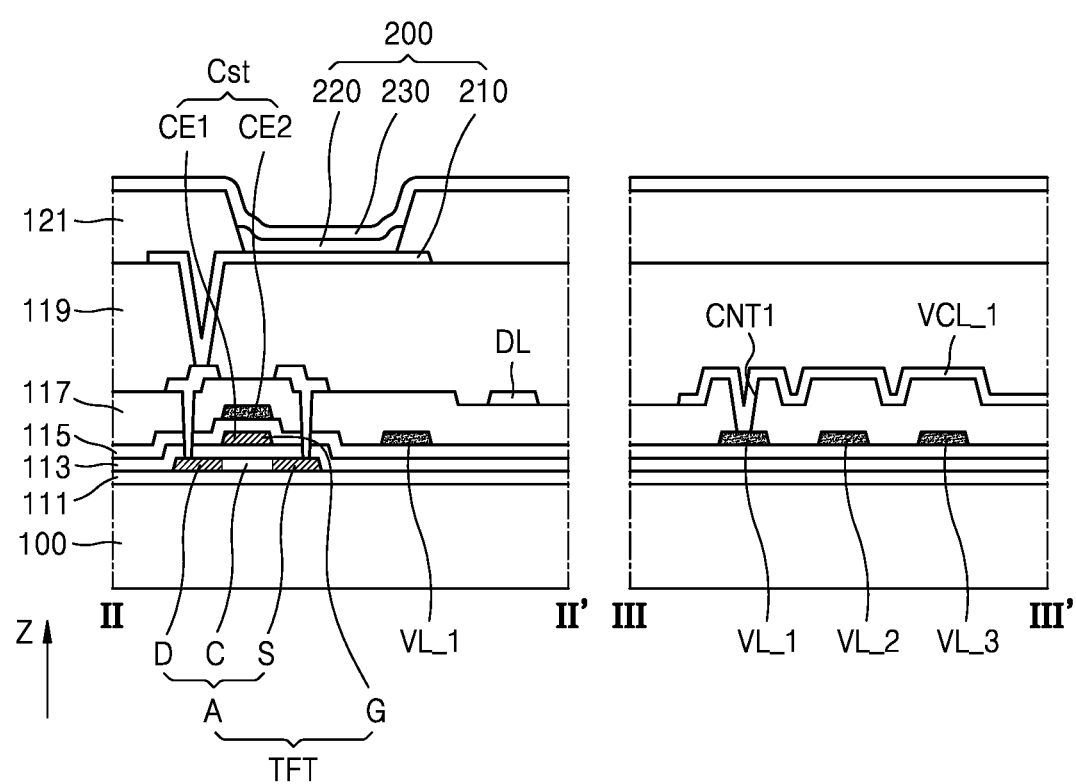
FIGS. 9A and 9B are cross-sectional views each taken along line II-II' and III-III' of a voltage wiring and a connection wiring of FIG. 8.
Figure 9B:
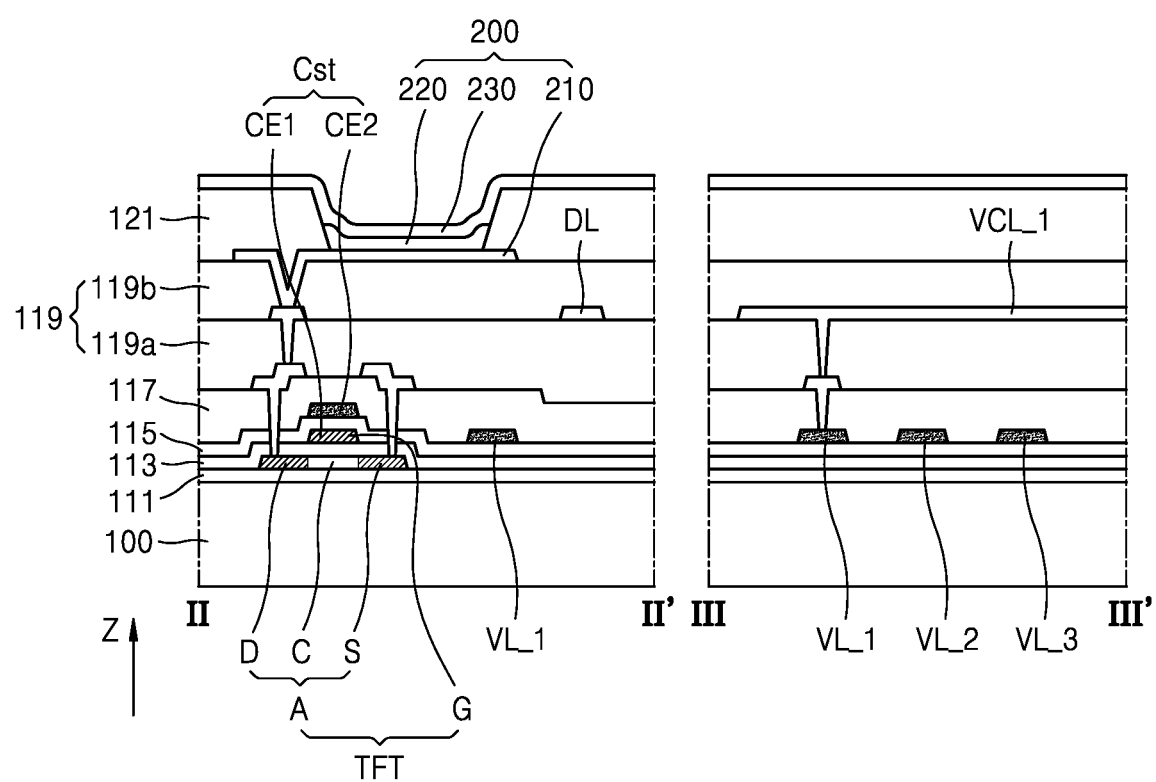

FIG. 8 is an enlarged plan view illustrating a portion AR of FIG. 7. FIGS. 9A and 9B are cross-sectional views each taken along lines II-II' and III-III' of a voltage wiring and a connection wiring of FIG. 8.

Referring to FIG. 8, the first-first voltage wiring VL_1 may be connected to the first-first connection wiring VCL_1 through a first contact hole CNT1, the second-first voltage wiring VL_2 may be connected to the second-first connection wiring VCL_2 through a second contact hole CNT2, and the third-first voltage wiring VL_3 may be connected to the third-first connection wiring VCL_3 through a third contact hole CNT3.

Elements included in the display apparatus 1 will be described in more detail according to a stacked structure with reference to FIGS. 9A and 9B, and a positional relationship between the first connection wiring VCL and the first voltage wiring VL will be described.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, or bendable. For example, the substrate 100 including the polymer resin may be flexed, rolled, and/or bent without sustaining cracking or other damage. The substrate 100 may have a multi-layer structure including a layer including the polymer resin and an inorganic layer.

A buffer layer 111 may reduce or block penetration of foreign materials, moisture, or external air from the bottom of the substrate 100 and may planarize the substrate 100. The buffer layer 111 may include an inorganic material such as oxide or nitride, an organic material, or a combination of an organic material and an inorganic material, and may have a single or multi-layer structure including an inorganic material and an organic material.

A barrier layer may be further provided between the substrate 100 and the buffer layer 111. The barrier layer may prevent or minimize penetration of impurities from the substrate 100 into a semiconductor layer A. The barrier layer may include an inorganic material such as oxide or nitride, an organic material, or a combination of an organic material and an inorganic material, and may have a single or multi-layer structure including an inorganic material and an organic material.

The semiconductor layer A may be disposed on the buffer layer 111. The semiconductor layer A may include amorphous silicon or polysilicon. According to an exemplary embodiment of the present disclosure, the semiconductor layer A may include an oxide of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

The semiconductor layer A may include a channel region C, and a source region S and a drain region D disposed on both sides of the channel region C. The semiconductor layer A may have a single or multi-layer structure.

A first gate insulating layer 113 and a second gate insulating layer 115 may be stacked on the substrate 100 to cover the semiconductor layer A. Each of the first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A gate electrode G may be disposed on the first gate insulating layer 113 to at least partially overlap the semiconductor layer A. Although the gate electrode G is disposed on the first gate insulating layer 113 in FIGS. 9A and 9B, according to an exemplary embodiment of the present disclosure, the gate electrode G may be disposed on a top surface of the second gate insulating layer 115. Also, the gate electrode G may be disposed on the same layer, or may be disposed on a different layer.

In an exemplary embodiment of the present disclosure, the storage capacitor Cst may include the lower electrode CE1 and the upper electrode CE2, and may overlap the thin-film transistor TFT as shown in FIGS. 9A and 9B. For example, the gate electrode G of the thin-film transistor TFT may function as the lower electrode CE1 of the storage capacitor Cst. According to an exemplary embodiment of the present disclosure, the storage capacitor Cst might not overlap the thin-film transistor TFT and may be disposed separately from the thin-film transistor TFT The upper electrode CE2 overlaps the lower electrode CE1 with the second gate insulating layer 115 disposed therebetween to form a capacitance. In this case, the second gate insulating layer 115 may function as a dielectric layer of the storage capacitor Cst.

In an exemplary embodiment of the present disclosure, the first-first voltage wiring VL_1 may be disposed on the same layer as the upper electrode CE2 of the storage capacitor Cst. When the first-first voltage wiring VL_1 is disposed on the same layer, it may mean that both the upper electrode CE2 of the storage capacitor Cst and the first-first voltage wiring VL_1 are disposed on the top surface of the second gate insulating layer 115. Although the first-first voltage wiring VL_1 has been described, the second-first voltage wiring VL_2 and the third-first voltage wiring VL_3 may also be disposed on the same layer as the upper electrode CE2 of the storage capacitor Cst.

An interlayer insulating layer 117 may be provided on the second gate insulating layer 115 to cover the upper electrode CE2 of the storage capacitor Cst. The interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A source electrode, a drain electrode, and the data line DL may be disposed on the interlayer insulating layer 117.

Each of the source electrode, the drain electrode, and the data line DL may include a conductive material including molybdenum (Mo), aluminum (Al), copper (Cu), and/or titanium (Ti) and may have a single or multi-layer structure including the above material. For example, each of the source electrode, the drain electrode, and the data line DL may have a multi-layer structure including Ti/Al/Ti. Each of the source electrode and the drain electrode may be connected to the source region S or the drain region D of the semiconductor layer A through a contact hole.

The source electrode, the drain electrode, and the data line DL may be covered by an inorganic protective layer. The inorganic protective layer may have a single or multi-layer structure including silicon nitride ($SiN_x$) and silicon oxide ($SiO_x$). The inorganic protective layer may be used to cover and protect some wirings disposed on the interlayer insulating layer 117.

In an exemplary embodiment of the present disclosure, the first-first connection wiring VCL_1 may be disposed on the same layer as the data line DL, and may be connected to the first-first voltage wiring VL_1 through the first contact hole CNT1 formed in the interlayer insulating layer 117.

When the first-first connection wiring VCL_1 is disposed on the same layer, it may mean that both the first-first connection wiring VCL_1 and the data line DL are disposed on a top surface of the interlayer insulating layer 117. Although the first-first connection wiring VCL_1 has been described, the second-first connection wiring VCL_2 and the third-first connection wiring VCL_3 may also be disposed on the same layer as the data line DL.

A planarization layer 119 covers the source electrode, the drain electrode, and the data line DL, and the planarization layer 119 has a contact hole through which the thin-film transistor TFT and a pixel electrode 210 are connected to each other.

The planarization layer 119 may have a single or multi-layer structure including an organic material, and may also have a flat (planar) top surface. The planarization layer 119 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

In an exemplary embodiment of the present disclosure, as shown in FIG. 9B, the planarization layer 119 may include a first planarization layer 119a and a second planarization layer 119b. The first-first connection wiring VCL_1 and the data line DL may be disposed on a top surface of the first planarization layer 119a, and the first-first connection wiring VCL_1 and the data line DL may be connected through contact holes formed in the interlayer insulating layer 117 and the first planarization layer 119a. Although the first-first connection wiring VCL_1 has been described, the description may also apply to the second-first connection wiring VCL_2 and the third-first connection wiring VCL_3.

A light-emitting device 200 is disposed on the planarization layer 119. The light-emitting device 200 includes the pixel electrode 210, an intermediate layer 220 including an organic emission layer, and the counter electrode 230.

The pixel electrode 210 may be a transmissive electrode, a semi-transmissive electrode, or a reflective electrode. In some embodiments, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective film. The transparent or semi-transparent electrode layer may include indium tin oxide (ITO), indium zinc oxide (IZO), zinc oxide (ZnO), indium oxide ($In_2O_3$), indium gallium oxide (IGO), and/or aluminum zinc oxide (AZO). In some embodiments, the pixel electrode 210 may include ITO/Ag/ITO.

A pixel-defining film 121 may be disposed on the planarization layer 119 in the display area DA of the substrate 100. Also, the pixel-defining film 121 may increase a distance between an edge of the pixel electrode 210 and the counter electrode 230 disposed over the pixel electrode 210, to prevent electrical arcing or the like from occurring on the edge of the pixel electrode 210.

The pixel-defining film 121 may be formed of at least one organic insulating material such as polyimide, polyamide, acrylic resin, benzocyclobutene, and/or phenolic resin by using spin coating or the like.

The intermediate layer 220 may be disposed in an opening formed by the pixel-defining film 121 and may include the organic emission layer. The organic emission layer may include an organic material including a fluorescent or phosphorescent material that emits red, green, blue, or white light. The organic emission layer may be formed of a low molecular weight organic material or a high molecular weight organic material, and functional layers such as a hole transport layer (HTL), a hole injection layer (HIL), an electron transport layer (ETL), and an electron injection layer (EIL) may be selectively disposed under and over the organic emission layer.

The counter electrode 230 may be a light-transmitting electrode or a reflective electrode. In some embodiments, the counter electrode 230 may be a transparent or semi-transparent electrode and may be formed of a metal thin film having a low work function (e.g. having a work function of 4.5 eV or lower) including lithium (Li), calcium (Ca), LiF/Ca, LiF/Al, aluminum (Al), silver (Ag), magnesium (Mg), or a compound thereof. Also, a transparent conductive oxide (TCO) film including ITO, IZO, ZnO, or $In_2O_3$ may be further disposed on the metal thin film. The counter electrode 230 may be disposed over the display area DA, and may be disposed on the intermediate layer 220 and the pixel-defining film 121. The counter electrode 230 may be integrally formed with a plurality of organic light-emitting diodes OLED to correspond to a plurality of pixel electrodes 210.

Because the organic light-emitting device may be easily damaged by external moisture or oxygen, an encapsulation layer may cover and protect the organic light-emitting device. The encapsulation layer may cover the display area DA and may extend to at least a part of the non-display area NDA. The encapsulation layer may include a first inorganic encapsulation layer, an organic encapsulation layer, and a second inorganic encapsulation layer.

Figure 10:
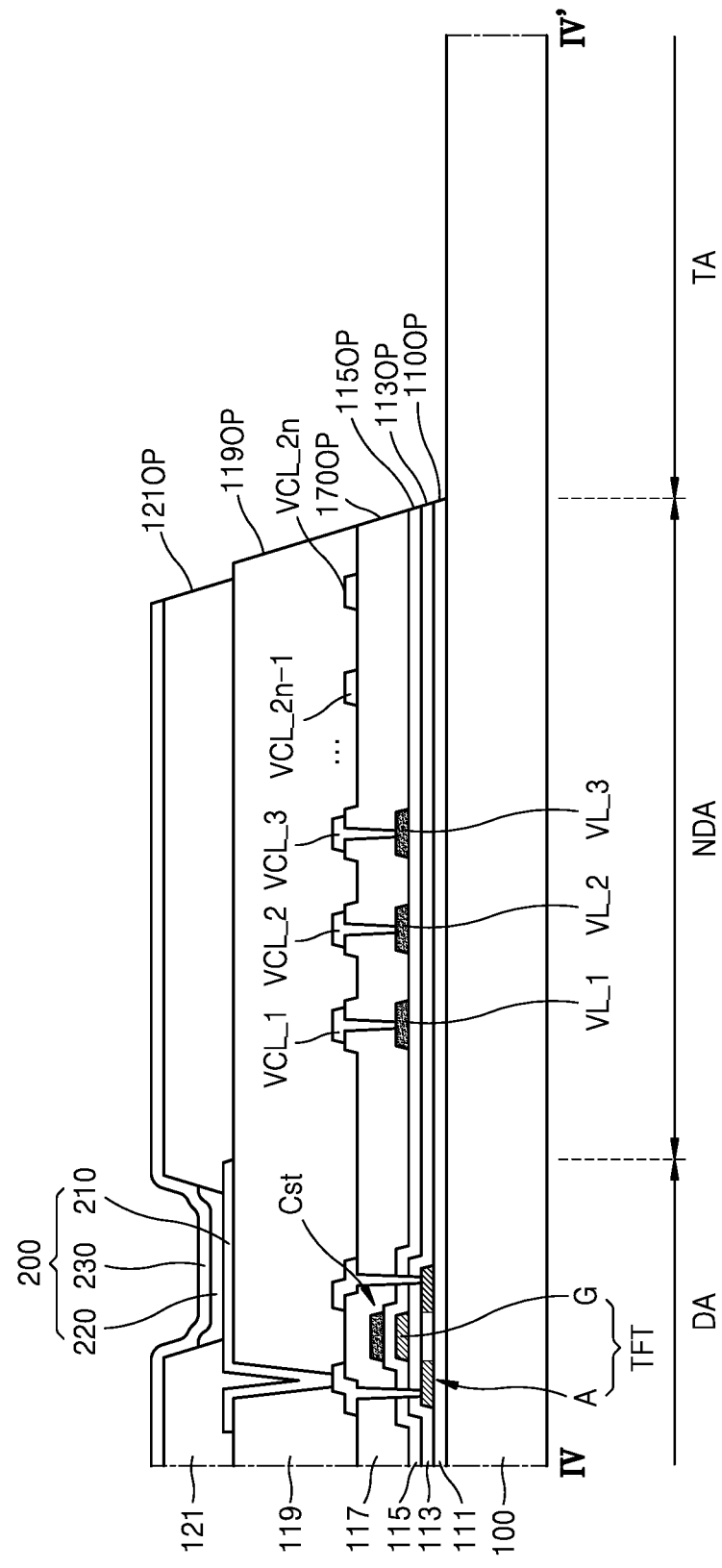
FIG. 10 is a cross-sectional view taken along line IV-IV' of the display panel of FIG. 7.

FIG. 10 is a cross-sectional view taken along line IV-IV' of the display panel of FIG. 7. In FIG. 10, the same elements as those in FIG. 9A are denoted by the same reference numerals and thus to the extent that an explanation of various elements have been omitted, it may be assumed that these elements are at least similar to corresponding elements that have been described elsewhere in the instant disclosure.

Referring to FIG. 10, the buffer layer 111, the first gate insulating layer 113, the second gate insulating layer 115, the interlayer insulating layer 117, the planarization layer 119, and the pixel-defining film 121 may be sequentially disposed on the substrate 100.

The thin-film transistor TFT including the semiconductor layer A and the gate electrode G and the storage capacitor Cst overlapping the thin-film transistor TFT may be disposed on a portion of the substrate 100 corresponding to the display area DA. Also, the light-emitting device 200 electrically connected to the thin-film transistor TFT may be disposed on the portion of the substrate 100 corresponding to the display area DA.

The plurality of connection wirings VCL and the plurality of voltage wirings VL may be disposed on a portion of the substrate 100 corresponding to the first non-display area NDA1 as described with reference to FIG. 9A. The plurality of connection wirings VCL may be disposed on the interlayer insulating layer 117, and the plurality of voltage wirings VL may be disposed on the second gate insulating layer 115. The plurality of connection wirings VCL may be respectively connected to the plurality of voltage wirings VL through contact holes formed in the interlayer insulating layer 117.

Alternatively, the planarization layer 119 may include the first planarization layer 119a and the second planarization layer 119b as described with reference to FIG. 9B, and the plurality of connection wirings VCL may be disposed on the first planarization layer 119a.

As described with reference to FIG. 2, the component 50 may be disposed under a portion of the substrate 100 corresponding to the transmitting area TA. The transmitting area TA may be an area through which light and/or sound output from the component 50 may pass through to a user or through which ambient light and/or sound may be received by the component 50. The component 50 may be an electronic element using light or sound, or may be a member other than an electronic element.

The buffer layer 111, the first gate insulating layer 113, the second gate insulating layer 115, and the interlayer insulating layer 117 on the portion of the substrate 100 corresponding to the transmitting area TA may each be removed, to expose a top surface of the portion of the substrate 100 corresponding to the transmitting area TA. The buffer layer 111, the first gate insulating layer 113, the second gate insulating layer 115, the interlayer insulating layer 117, the planarization layer 119, and the pixel-defining film 121 may respectively have openings 111OP, 113OP, 115OP, 117OP, 119OP, and 121OP corresponding to the transmitting area TA. Light and/or sound may be transmitted through the openings 111OP, 113OP, 115OP, 117OP, 119OP, and 121OP formed in the transmitting area TA.

Figure 11:
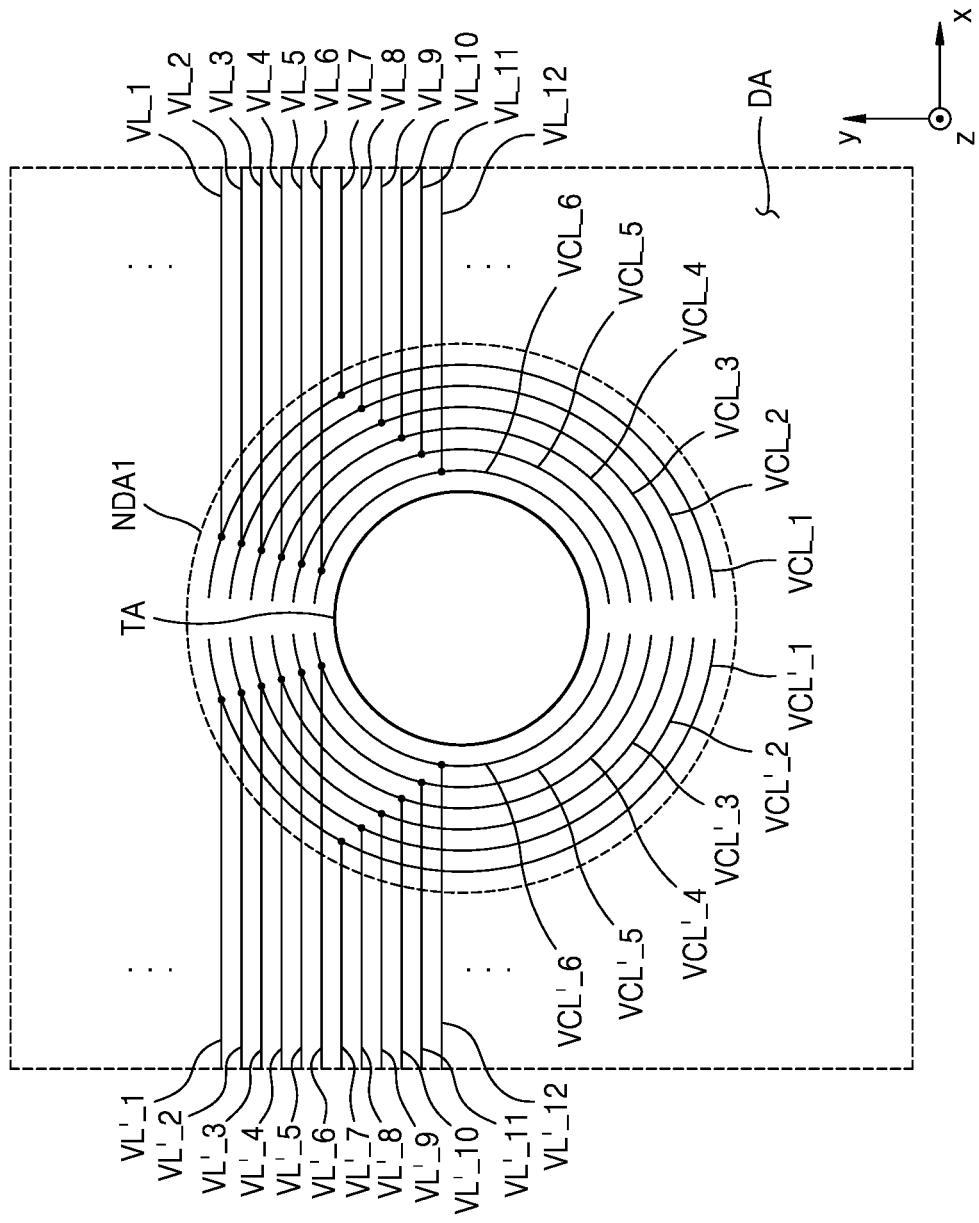
FIG. 11 is a plan view illustrating a plurality of voltage wirings and a plurality of connection wirings of a display panel according to an exemplary embodiment of the present disclosure.

FIG. 11 is a plan view illustrating a plurality of voltage wirings and a plurality of connection wirings of a display panel according to an exemplary embodiment of the present disclosure. For example, FIG. 11 corresponds to a case where n is 3 in FIG. 7.

Referring to FIG. 11, the display panel 10 includes the transmitting area TA. The display area DA surrounding the transmitting area TA. The first non-display area NDA1 is disposed between the transmitting area TA and the display area DA. Also, the display panel 10 includes the plurality of pixels PX arranged within the display area DA, the plurality of connection wirings VCL and VCL' disposed in the first non-display area NDA1 and extending along at least a part of an edge of the transmitting area TA, and the plurality of voltage wirings VL and VL' extending in a first direction (x) and connected to at least some of the pixels PX disposed in the same row from among the plurality of pixels PX.

One end of each of the plurality of voltage wirings VL and VL' may be connected to one of the plurality of connection wirings VCL and VCL', and the other end of each of the plurality of voltage wirings VL and VL' may be connected to the initialization voltage supply wiring 170 (see FIG. 3) disposed in the second non-display area NDA2 (see FIG. 3). The plurality of voltage wirings VL and VL' may correspond to the initialization voltage line VL (see FIG. 2).

The plurality of connection wirings VCL and VCL' may include the plurality of first connection wirings VCL and the plurality of second connection wirings VCL' disposed on opposite sides of the transmitting area TA. The plurality of first connection wirings VCL may be spaced apart from the plurality of second connection wirings VCL'. Also, the plurality of voltage wirings VL and VL' may include the plurality of first voltage wirings VL and the plurality of second voltage wirings VI spaced apart from each other by the transmitting area TA. Each of the plurality of first voltage wirings VL may be connected to one of the plurality of first connection wirings VCL, and each of the plurality of second voltage wirings VL' may be connected to one of the plurality of second connection wirings VCL'. Although the plurality of first connection wirings VCL and the plurality of second connection wirings VCL' are spaced apart from each other in FIG. 11, according to an exemplary embodiment of the present disclosure, the plurality of first connection wirings VCL and the plurality of second connection wirings VCL' may be integrally connected to each other.

In an exemplary embodiment of the present disclosure, a scan driving circuit included in each of the first gate driving circuit 130 (see FIG. 3) and the second gate driving circuit 140 (see FIG. 3) may be configured to sequentially output scan signals to the scan lines SL in an MC 3-clk mode.

In this case, the number of the plurality of first connection wirings VCL may be 6, and first through sixth first voltage wirings VL_1, VL_2, VL_3, VL_4, VL_5, and VL_6 from among the plurality of first voltage wirings VL may be connected in a one-to-one manner to six first connection wirings VCL_1, VCL_2, VCL_3, VCL_4, VCL_5, and VCL_6 according to a predetermined order.

Also, the first connection wiring VCL connected to an $i^{th}$ first voltage wiring VL_i from among the plurality of first voltage wirings VL from among the six first connection wirings VCL_1, VCL_2, VCL_3, VCL_4, VCL_5, and VCL_6 may be the same as the first connection wiring VCL connected to a $(6+i)^{th}$ first voltage wiring VL_6+i from among the plurality of first voltage wirings VL from among the six first connection wirings VCL_1, VCL_2, VCL_3, VCL_4, VCL_5, and VCL_6. Here, i is a positive integer.

For example, the first-first voltage wiring VL_1 may be connected to the first-first connection wiring VCL_1, the second-first voltage wiring VL_2 may be connected to the second-first connection wiring VCL_2, the third-first voltage wiring VL_3 may be connected to the third-first connection wiring VCL_3, the fourth-first voltage wiring VL_4 may be connected to the fourth-first connection wiring VCL_4, the fifth-first voltage wiring VL_5 may be connected to the fifth-first connection wiring VCL_5, and the sixth-first voltage wiring VL_6 may be connected to the sixth-first connection wiring VCL_6.

A seventh-first voltage wiring VL_7 may be connected to the first-first connection wiring VCL_1 like the first-first voltage wiring VL_1, an eighth-first voltage wiring VL_8 may be connected to the second-first connection wiring VCL_2 like the second-first voltage wiring VL_2, a ninth-first voltage wiring VL_9 may be connected to the third-first connection wiring VCL_3 like the third-first voltage wiring VL_3, a tenth-first voltage wiring VL_10 may be connected to the fourth-first connection wiring VCL_4 like the fourth-first voltage wiring VL_4, an eleventh-first voltage wiring VL_11 may be connected to the fifth-first connection wiring VCL_5 like the fifth-first voltage wiring VL_5, and a twelfth-first voltage wiring VL_11 may be connected to the sixth-first connection wiring VCL_6 like the sixth-first voltage wiring VL_6.

Although the plurality of first connection wirings VCL and the plurality of first voltage wirings VL have been described, the description may also apply to the plurality of second connection wirings VCL' and the plurality of second voltage wirings VL'. For example, the number of the plurality of second connection wirings VCL' may be 6, and first through sixth second voltage wirings VL'_1, VL'_2, VL'_3, VL'_4, VL'_5, and VL'_6 from among the plurality of second voltage wirings VL' may be connected in a one-to-one manner to six second connection wirings VCL'_1, VCL'_2, VCL'_3, VCL'_4, VCL'_5, and VCL'_6 according to a predetermined order.

Figure 12:
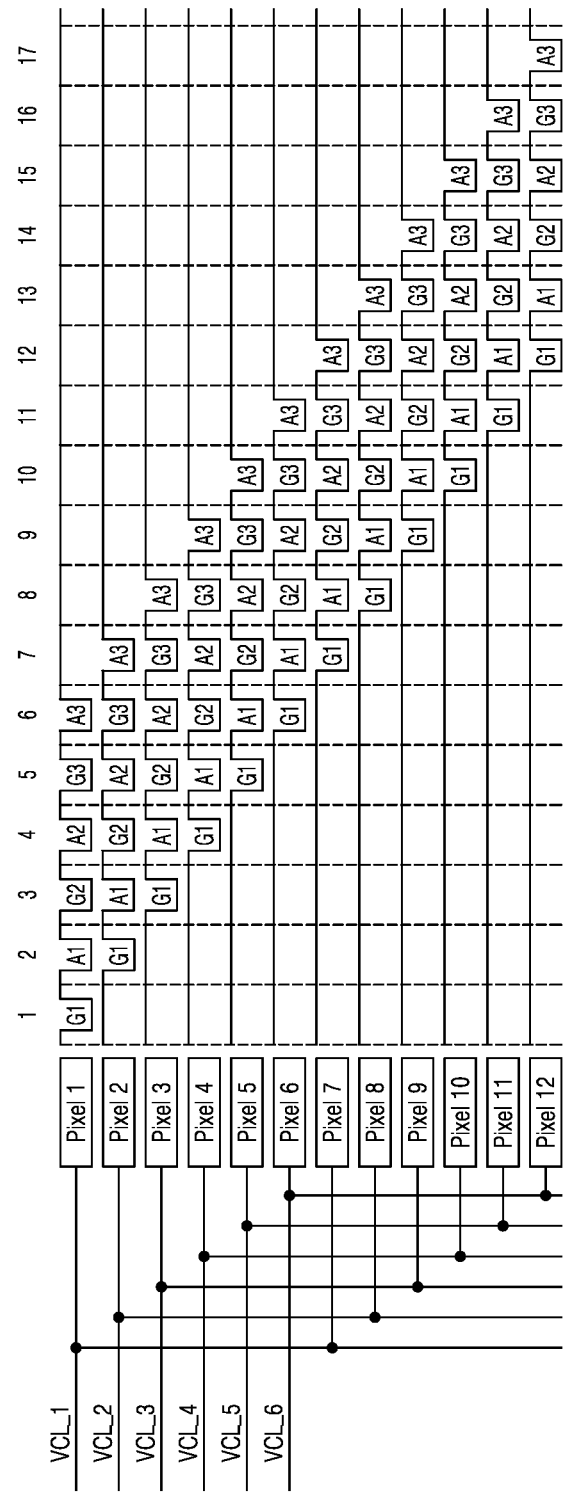
FIG. 12 is a timing diagram illustrating a method in which a plurality of pixels are driven by a scan signal according to an exemplary embodiment of the present disclosure.

FIG. 12 is a timing diagram illustrating a method in which a plurality of pixels are driven by a scan signal according to an exemplary embodiment of the present disclosure. For example, gate/anode initialization periods of a plurality of pixels connected to a plurality of voltage wirings are all illustrated.

Referring to FIG. 12, a gate/anode initialization period of each pixel may be checked. In each pixel, gate/anode initialization is performed according to an MC 3-ctk driving mode, and in first through twelfth pixels PX1, PX2, PX3, PX4, PX5, PX6, PX7, PX8, PX9, PX10. PX11, and PX12 disposed in different rows, gate/anode initialization is sequentially performed.

In the first pixel PX1 connected to the first-first connection wiring VCL_1, first gate initialization G1 of a first interval, first anode initialization A1 of a second interval, second gate initialization G2 of a third interval, second anode initialization A2 of a fourth interval, third gate initialization G3 of a fifth interval, and third anode initialization A3 of a sixth interval are performed. As such, a gate initialization period and an anode initialization period are alternately performed during a total of six intervals.

Gate/anode initialization is performed during second through seventh intervals in the second pixel PX2 connected to the second-first connection wiring VCL_2, gate/anode initialization is performed during third through eighth intervals in the third pixel PX3 connected to the third-first connection wiring VCL_3, gate/anode initialization is performed during fourth through ninth intervals in the fourth pixel PX4 connected to the fourth-first connection wiring VCL_4, gate/anode initialization is performed during fifth through tenth intervals in the fifth pixel PX5 connected to the fifth-first connection wiring VCL_5, and gate/anode initialization is performed during sixth through eleventh intervals in the sixth pixel PX6 connected to the sixth-first connection wiring VCL_6.

Gate/anode initialization is performed during seventh through twelfth intervals in the seventh pixel PX7 connected to the first-first connection wiring VCL_1, gate/anode initialization is performed during eighth through thirteenth intervals in the eighth pixel PX8 connected to the second-first connection wiring VCL_2, gate/anode initialization is performed during ninth through fourteenth intervals in the ninth pixel PX9 connected to the third-first connection wiring VCL_3, gate/anode initialization is performed during tenth through fifteenth intervals in the tenth pixel PX10 connected to the fourth-first connection wiring VCL_4, gate/anode initialization is performed during eleventh through sixteenth intervals in the eleventh pixel PX II connected to the fifth-first connection wiring VCL_5, and gate/anode initialization is performed during twelfth through seventeenth intervals in the twelfth pixel PX12 connected to the sixth-first connection wiring VCL_6.

When gate/anode initialization periods of the first pixel PX1 and the seventh pixel PX7 each connected to the first-first connection wiring VCL_1 are compared with each other, the gate/anode initialization period of the first pixel PX1 corresponds to the first through sixth intervals, and the gate/anode initialization period of the seventh pixel PX7 corresponds to the seventh through twelfth intervals. Accordingly, the gate/anode initialization periods of the first pixel PX1 and the seventh pixel PX7 do not overlap each other.

As such, the second pixel PX2 and the eighth pixel PX8 whose gate/anode initialization periods do no overlap each other are connected to the second-first connection wiring VCL_2, the third pixel PX3 and the ninth pixel PX9 whose gate/anode initialization periods do not overlap each other are connected to the third-first connection wiring VCL_3, the fourth pixel PX4 and the tenth pixel PX10 whose gate/anode initialization periods do not overlap each other are connected to the fourth-first connection wiring VCL_4, the fifth pixel PX5 and the eleventh pixel PX11 whose gate/anode initialization periods do not overlap each other are connected to the fifth-first connection wiring VCL_5, and the sixth pixel PX6 and the twelfth pixel PX12 whose gate/anode initialization periods do not overlap each other may be connected to the sixth-first connection wiring VCL_6.

In a general MC n-clk mode, a gate/anode initialization period of one pixel may correspond to $k^{th}$ through $(k+2n-1)^{th}$ intervals, and a pixel PX_i disposed in an $i^{th}$ row and a pixel PX_2n+i disposed in a $(2n+i)^{th}$ row from among the plurality of pixels may be connected to the same connection wiring. Here, k and i are each positive integers.

As a comparative example, pixels whose gate/anode initialization periods overlap each other may be connected to the same connection wiring. In this case, an initialization load of each of the pixels is reduced and an initialization voltage drop itself is reduced. As a result, a luminance of the pixels increases and the pixels look brighter than pixels whose gate/anode initialization periods do not overlap each other. A luminance deviation occurs between the pixels.

However, as in an exemplary embodiment of the present disclosure, pixels whose gate/anode initialization periods overlap each other may be connected to different connection wirings, and pixels whose gate/anode initialization periods do not overlap each other may be connected to the same connection wiring. In this case, there is no change in an initialization load of each of pixels and a luminance deviation between the pixels is reduced.

Referring back to FIG. 12, in an arbitrary interval, pixels connected to $j^{th}$ through $(j+5)^{th}$ voltage wirings from among the plurality of voltage wirings VL and VL' (see FIG. 10) may receive an initialization voltage through the $j^{th}$ through $(j+5)^{th}$ voltage wirings in response to six scan signals. Here, j is a positive integer. For example, referring to the seventh interval, the second through seventh pixels PX2, PX3, PX4, PX5, PX6, and PX7 connected to second through seventh voltage wirings may receive an initialization voltage in response to scan signals and may perform gate/anode initialization.

Also, the $j^{th}$ through $(j+5)^{th}$ voltage wirings may be connected to different connection wirings from among six connection wirings. For example, referring to the seventh interval, the second through seventh pixels PX2, PX3, PX4, PX5, PX6, and PX7 connected to the second through seventh voltage wirings may be connected to different connection wirings from among the first through sixth first connection wirings VCL_1, VCL_2, VCL_3, VCL_4, VCL_5, and VCL_6. For example, the second pixel PX2 may be connected to the second-first connection wiring VCL_2, the third pixel PX3 may be connected to the third-first connection wiring VCL_3, the fourth pixel PX4 may be connected to the fourth-first connection wiring VCL_4, the fifth pixel PX5 may be connected to the fifth-first connection wiring VCL_5, the sixth pixel PX6 may be connected to the sixth-first connection wiring VCL_6, and the seventh pixel PX7 may be connected to the first-first connection wiring VCL_1.

In a general MC n-clk mode, in an arbitrary interval, pixels connected to $j^{th}$ through $j+2n-1)^{th}$ voltage wirings from among the plurality of voltage wirings VL and VL may receive an initialization voltage through the $j^{th}$ through $(j+2n-1)^{th}$ voltage wirings in response to n scan signals.

Also, the $j^{th}$ through $(j+2n-1)^{th}$ voltage wirings may be connected to different connection wirings from among 2n connection wirings.

Figure 13:
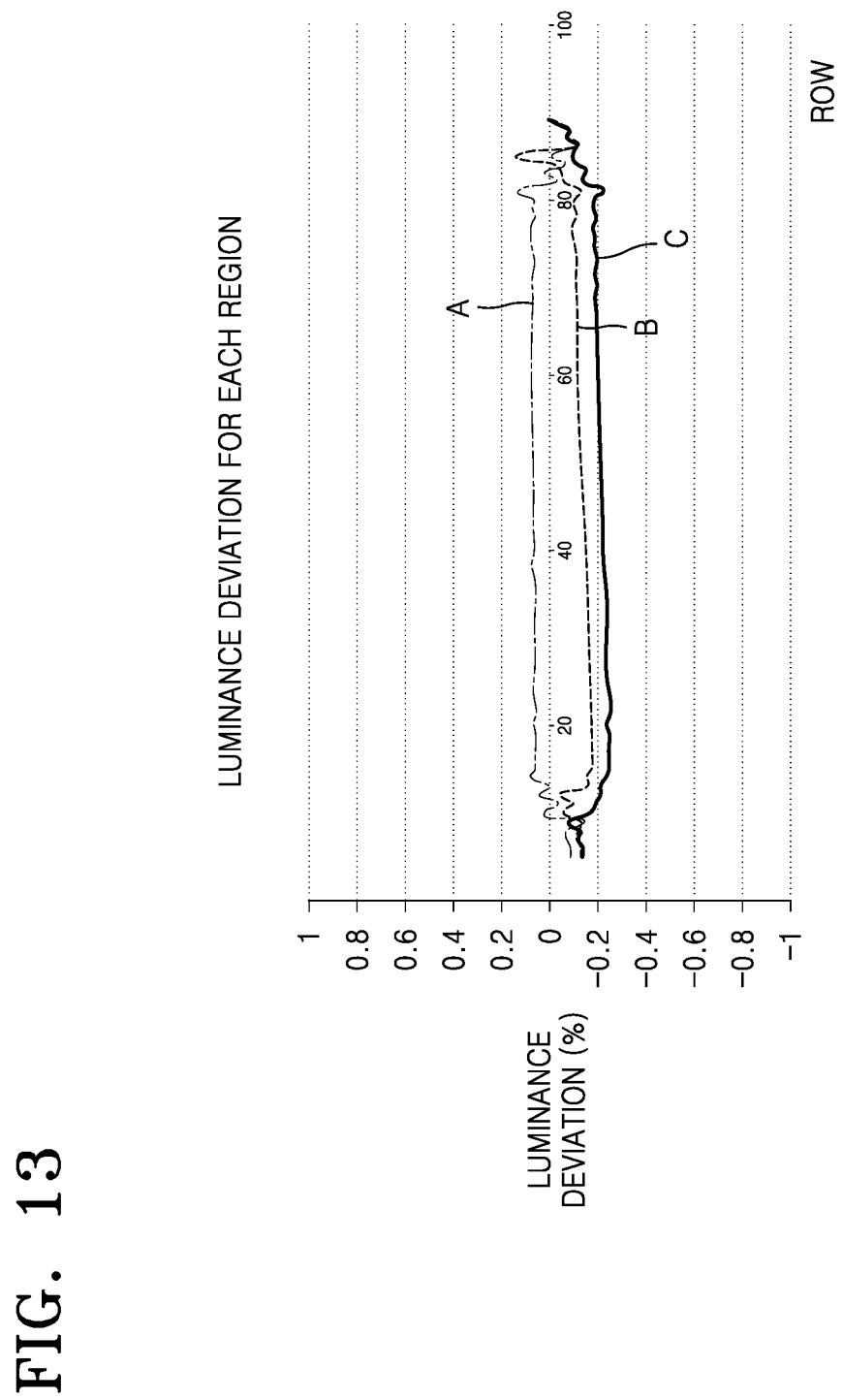
FIG. 13 is a graph illustrating a luminance deviation for each region of a display panel according to an exemplary embodiment of the present disclosure.

FIG. 13 is a graph showing a luminance deviation for each region of a display panel according to an exemplary embodiment of the present disclosure.

Referring to FIG. 13, when $j^{th}$ through $(j+2n-1)^{th}$ voltage wirings in an MC n-clk driving mode are connected to different connection wirings from among 2n connection wirings, a luminance deviation for each region may be checked.

A region A corresponds to the display area DA (see FIG. 3) disposed in a +x-direction from the transmitting area TA (see FIG. 3), a region B corresponds to the display area DA disposed in a −x-direction from the transmitting area TA, and a region C corresponds to the display area DA other than the regions A and B.

The graph shows a luminance of pixels disposed in the same row of the region A, a luminance of pixels disposed in the same row in the region B, and a luminance of pixels disposed in the same row in the region C, and luminances for regions may be compared with one another.

When the luminances of the pixels disposed in the region A, the region B, and the region C are compared with one another, a luminance deviation is equal to or less than about 0.2%. Accordingly, there is an insignificant (i.e. unnoticeable) luminance difference between the pixels disposed in the region A, the region B, and the region C.

Accordingly, when pixels whose gate/anode initialization periods overlap each other are connected to different connection wirings and pixels whose gate/anode initialization periods do not overlap each other are connected to the same connection wiring from among the plurality of pixels disposed in the x-direction from the transmitting area TA, there is no change in an initialization load of each of the pixels and a luminance deviation between the pixels is reduced.

Although a display apparatus has been mainly described in relation to exemplary embodiments of the present disclosure, the invention is not necessarily limited thereto. For example, a method of manufacturing the display apparatus may also fall within the scope of the present disclosure.

According to the one or more exemplary embodiments of the present disclosure, a display apparatus in which a luminance difference between a plurality of pixels disposed in a display area on the left and right sides of a transmitting area and a plurality of pixels disposed in other display areas is reduced may be provided. However, the present invention is not necessarily limited by the effect.

While one or more embodiments have been described with reference to the figures, it will be understood by those of ordinary skill in the art that various changes in form and details may be made therein without departing from the spirit and scope as of the present disclosure.

What is claimed is:

1. A display apparatus, comprising:
    a substrate comprising a transmitting area, a display area at least partially surrounding the transmitting area, a first non-display area disposed between the transmitting area and the display area, and a second non-display area at least partially surrounding the display area;
    a plurality of pixels arranged within the display area;
    a plurality of connection wirings disposed in the first non-display area, each of the plurality of connection wirings extending along at least a part of an edge of the transmitting area; and
    a plurality of voltage wirings each of which extends in a first direction and connects to at least some of pixels disposed in a common row from among the plurality of pixels,
    wherein the plurality of connection wirings includes 2n connection wirings, where n is a positive integer,
    wherein each of the plurality of voltage wirings is connected to one of the 2n connection wirings, and
    wherein first through $2n^{th}$ voltage wirings from among the plurality of voltage wirings are connected in a one-to-one manner to the 2n connection wirings.

2. The display apparatus of claim 1, wherein a connection wiring, from among the 2n connection wirings, connected to an $i^{th}$ voltage wiring from among the plurality of voltage wirings is the same as a connection wiring, from among the 2n connection wirings, connected to a $(2n+i)^{th}$ voltage wiring from among the plurality of voltage wirings, wherein i is a positive integer.

3. The display apparatus of claim 1, further comprising:
    a plurality of first scan lines each extending in the first direction and connected to the pixels disposed in the common row from among the plurality of pixels;
    a plurality of second scan lines each extending in the first direction and connected to the pixels disposed in the common row from among the plurality of pixels; and
    a gate driving circuit disposed in the second non-display area and configured to drive the plurality of first scan lines and the plurality of second scan lines,
    wherein each of the plurality of first scan lines is additionally connected to pixels disposed in a previous row, that is previous to the common row, from among the plurality of pixels.

4. The display apparatus of claim 3, wherein the gate driving circuit is configured to sequentially output first and second scan signals to the plurality of first and second scan lines in an MC n-clk mode,
    wherein each of the plurality of first scan lines transmits n first scan signals during a first frame,
    wherein each of the plurality of second scan lines transmits n second scan sigh is during a second frame, and
    wherein the pixels alternately receive the n first scan signals and the as second scan signals.

5. The display apparatus of claim 4, wherein, in a first interval, pixels connected to $j^{th}$ through $(j+2n-1)^{th}$ voltage wirings from among the plurality of voltage wirings receive an initialization voltage through the $j^{th}$ through $(j+2n-1)^{th}$ voltage wirings in response to the n first scan signals, wherein j is a positive integer.

6. The display apparatus of claim 5, wherein the $j^{th}$ through $(j+2n-1)^{th}$ voltage wirings are connected to different connection wirings from among the 2n connection wirings.

7. The display apparatus of claim 2, wherein pixels connected to a $j^{th}$ voltage wiring from among the plurality of voltage wirings receive an initialization voltage during $k^{th}$ through $(k+2n-1)^{th}$ intervals through the $j^{th}$ voltage wiring in response to the n first scan signals, wherein k is a positive integer.

8. The display apparatus of claim 1, further comprising an initialization voltage supply wiring disposed in the second non-display area,
    wherein a first end of the plurality of voltage wirings is connected to the 2n connection wirings, respectively, and a second end of the plurality of voltage wirings is connected to the initialization voltage supply wiring.

9. The display apparatus of claim 1, wherein each of the plurality of voltage wirings comprises a plurality of first voltage wirings and a plurality of second voltage wirings spaced apart from each other by the transmitting area.

10. The display apparatus of claim 9, wherein the 2n connection wirings comprise 2n first connection wirings and 2n second connection wirings disposed on opposite sides of the transmitting area, the 2n first connection wirings being spaced apart from the 2n second connection wirings.

11. The display apparatus of claim 10, wherein each of the plurality of first voltage wirings is connected to one of the 2n first connection wirings, and
wherein each of the plurality of second voltage wirings is connected to one of the 2n second connection wirings.

12. The display apparatus of claim 1, further comprising:
a storage capacitor comprising a lower electrode and an upper electrode disposed on and at least partially overlapping the lower electrode;
an insulating layer disposed on the storage capacitor; and
a data line disposed on the insulating layer,
wherein the plurality of voltage wirings and the upper electrode are disposed on the same layer, and
wherein the 2n connection wirings and the data line are disposed on the same layer.

13. The display apparatus of claim 1, wherein each of the plurality of pixels receives first through third scan signals, a data voltage, and an initialization voltage, and comprises:
a light-emitting device;
a driving thin-film transistor configured to control a level of current flowing through the light-emitting device according to a gate-source voltage;
a storage capacitor disposed between a power supply line and a gate of the driving thin-film transistor;
a scan thin-film transistor configured to transmit the data voltage to a source of the driving thin-film transistor in response to the second scan signal;
a compensation thin-film transistor configured to connect a drain of the driving thin-film transistor to the gate of the driving thin-film transistor in response to the second scan signal;
a gate initialization thin-film transistor configured to apply the initialization voltage to the gate of the driving thin-film transistor in response to the first scan signal; and
an anode initialization thin-film transistor configured to apply the initialization voltage to an anode of the light-emitting device in response to the third scan signal.

14. The display apparatus of claim 13, wherein for the pixels disposed in the common row from among the plurality of pixels, the first scan signal is synchronized with a second scan signal of a previous row, and the third scan signal is the same as a first scan signal of a next row.

15. A display apparatus, comprising:
a substrate comprising a transmitting area, a display area at least partially surrounding the transmitting area, a first non-display area disposed between the transmitting area and the display area, and a second non-display area at least partially surrounding the display area;
a plurality of pixels arranged in the display area;
six connection wirings disposed in the first non-display area and extending along at least a part of an edge of the transmitting area, and
a plurality of voltage wirings each extending in a first direction and connected to at least some of pixels disposed in a common row from among the plurality of pixels, wherein each of the plurality of voltage wirings is connected to one of the six connection wirings, and
wherein first through sixth voltage wirings from among the plurality of voltage wirings are connected in a one-to-one manner to the six connection wirings.

16. The display apparatus of claim 15, wherein a connection wiring, from among the six connection wirings, connected to an $i^{th}$ voltage wiring from among the plurality of voltage wirings is the same as a connection wiring, from among the six connection wirings, connected to a $(6+i)^{th}$ voltage wiring from among the plurality of voltage wirings, wherein i is a positive integer.

17. The display apparatus of claim 15, further comprising:
a plurality of first scan lines each extending in the first direction and connected to the pixels disposed in the common row from among the plurality of pixels;
a plurality of second scan lines each extending in the first direction and connected to the pixels disposed in the common row from among the plurality of pixels; and
a gate driving circuit disposed in the second non-display area and configured to drive the plurality of first scan lines and the plurality of second scan lines,
wherein each of the plurality of first scan lines is also connected to pixels disposed in a previous row, that is previous to the common row, from among the plurality of pixels,
wherein the gate driving circuit is configured to sequentially output first and second scan signals to the plurality of first and second scan lines in an MC 3-clk mode,
wherein each of the plurality of first scan lines transmits three first scan signals during a first frame,
wherein each of the plurality of second scan lines transmits three second scan signals during a second frame, and
wherein the pixels alternately receive the three first scan signals and the three second scan signals.

18. The display apparatus of claim 17, wherein, in a first interval, pixels of the plurality of pixels connected to $j^{th}$ through $(j+5)^{th}$ voltage wirings from among the plurality of voltage wirings receive an initialization voltage through the $j^{th}$ through $(j+5)^{th}$ voltage wirings in response to the three first scan signals, wherein j is a positive integer.

19. A display apparatus, comprising:
a substrate including a display area, an opening within the display area and a non-display area disposed between the opening and the display area;
a plurality of connection wirings disposed in the non-display area and at least partially circumscribing the opening; and
a plurality of voltage wirings connecting each of the plurality of connection wirings in a one-to-one manner to corresponding pixels disposed in a common row within the display area.

20. The display apparatus of claim 19, wherein the plurality of connection wirings includes 2n connection wirings, where n is a positive integer.

21. The display apparatus of claim 19, wherein the opening has a substantially curved side, each of the plurality of connection wirings are curved, and wherein each of the plurality of voltage wirings are straight.

* * * * *